(12) United States Patent
Shibata et al.

(10) Patent No.: US 12,171,061 B2
(45) Date of Patent: Dec. 17, 2024

(54) SEMICONDUCTOR APPARATUS WITH INSPECTION TERMINALS

(71) Applicant: SEIKO EPSON CORPORATION, Tokyo (JP)

(72) Inventors: Kyosuke Shibata, Nagano (JP); Toru Matsuyama, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 640 days.

(21) Appl. No.: 17/184,681

(22) Filed: Feb. 25, 2021

(65) Prior Publication Data

US 2021/0274643 A1 Sep. 2, 2021

(30) Foreign Application Priority Data

Feb. 27, 2020 (JP) ................. 2020-031814

(51) Int. Cl.
| | |
|---|---|
| *H05K 1/02* | (2006.01) |
| *H01L 23/498* | (2006.01) |
| *H05K 1/11* | (2006.01) |
| *H05K 1/18* | (2006.01) |

(52) U.S. Cl.
CPC ....... *H05K 1/029* (2013.01); *H01L 23/49816* (2013.01); *H05K 1/0268* (2013.01); *H05K 1/0287* (2013.01); *H05K 1/111* (2013.01); *H05K 1/181* (2013.01); *H05K 2201/10159* (2013.01); *H05K 2201/10212* (2013.01)

(58) Field of Classification Search
CPC .... H05K 1/029; H05K 1/0268; H05K 1/0287; H05K 1/111; H05K 1/181; H01L 23/49816
See application file for complete search history.

(56) References Cited

U.S. PATENT DOCUMENTS

| | | |
|---|---|---|
| 6,353,905 B1 | 3/2002 | Noguchi |
| 6,370,665 B1 | 4/2002 | Noguchi |
| 6,415,348 B1 | 7/2002 | Mergard et al. |
| 6,678,838 B1 | 1/2004 | Magro |

(Continued)

FOREIGN PATENT DOCUMENTS

| | | |
|---|---|---|
| JP | 2001-099896 A | 4/2001 |
| JP | 2004-022664 A | 1/2004 |

(Continued)

*Primary Examiner* — Phong H Dang
(74) *Attorney, Agent, or Firm* — Global IP Counselors, LLP

(57) ABSTRACT

There is provided a semiconductor apparatus including: a memory operation terminal for inputting a first signal; a high-speed communication terminal for inputting a second signal to a high-speed communication controller; an inspection terminal for performing debugging; and a terminal mounting surface at which a plurality of coupling terminals including the memory operation terminal, the high-speed communication terminal, and the inspection terminal are provided, in which the terminal mounting surface includes a first side, a second side, a third side, and a fourth side, the plurality of coupling terminals include a first terminal row located adjacent to the third side and arranged from the first side toward the second side; the first terminal row includes a first inspection terminal among the plurality of inspection terminals, and the first inspection terminal is located closest to the first side in the first terminal row.

18 Claims, 9 Drawing Sheets

(56) References Cited

U.S. PATENT DOCUMENTS

| | | | |
|---|---|---|---|
| 7,091,598 B2 | 8/2006 | Fujita et al. | |
| 7,323,771 B2 | 1/2008 | Fujita et al. | |
| 7,371,687 B2 | 5/2008 | Fujita et al. | |
| 7,610,526 B2 | 10/2009 | Sherlock et al. | |
| 7,687,803 B2* | 3/2010 | Takagi | G01R 1/0491 |
| | | | 257/E23.179 |
| 8,589,441 B1 | 11/2013 | Sunada et al. | |
| 2002/0062466 A1 | 5/2002 | Noguchi | |
| 2004/0061147 A1 | 4/2004 | Fujita et al. | |
| 2004/0232548 A1* | 11/2004 | Maruko | H01L 23/49838 |
| | | | 257/E23.07 |
| 2006/0168483 A1* | 7/2006 | Sherlock | G01R 31/31858 |
| | | | 714/43 |
| 2006/0231935 A1* | 10/2006 | Nishida | H01L 23/49816 |
| | | | 257/E21.511 |
| 2006/0237835 A1 | 10/2006 | Fujita et al. | |
| 2006/0244122 A1 | 11/2006 | Fujita et al. | |
| 2007/0006035 A1 | 1/2007 | Usui | |
| 2008/0303173 A1* | 12/2008 | Hamada | G01R 31/318555 |
| | | | 257/E21.531 |
| 2010/0005281 A1 | 1/2010 | Buchmann et al. | |
| 2011/0113298 A1* | 5/2011 | Van Den Eijnden | |
| | | | G01R 31/31855 |
| | | | 714/E11.155 |
| 2012/0133381 A1* | 5/2012 | Bruland | H01L 22/32 |
| | | | 257/E21.531 |
| 2012/0286849 A1* | 11/2012 | Lee | G11C 17/16 |
| | | | 327/525 |
| 2013/0238933 A1* | 9/2013 | Shin | G06F 11/27 |
| | | | 714/30 |
| 2014/0333459 A1* | 11/2014 | Oshima | H03M 1/1033 |
| | | | 341/120 |
| 2015/0061505 A1 | 3/2015 | Asami | |
| 2015/0156872 A1 | 6/2015 | Ossimitz | |
| 2015/0236512 A1* | 8/2015 | Whitney | G06F 13/4068 |
| | | | 307/80 |
| 2016/0154049 A1* | 6/2016 | Oshiyama | H01L 22/32 |
| | | | 327/296 |
| 2016/0322503 A1 | 11/2016 | Tezuka et al. | |
| 2016/0352787 A1 | 12/2016 | Kato | |
| 2017/0285968 A1* | 10/2017 | Jung | G06F 3/0656 |
| 2018/0081847 A1* | 3/2018 | Parthasarathy | G06F 9/4403 |
| 2018/0270956 A1 | 9/2018 | Kimura | |
| 2019/0079826 A1* | 3/2019 | Gianisis | G06F 11/0721 |
| 2019/0088623 A1 | 3/2019 | Matsumoto et al. | |
| 2020/0006163 A1* | 1/2020 | Amir | H01L 23/481 |
| 2020/0264389 A1 | 8/2020 | Ishibashi et al. | |
| 2020/0272120 A1* | 8/2020 | Fujimura | H02P 5/68 |

FOREIGN PATENT DOCUMENTS

| | | |
|---|---|---|
| JP | 2004-342947 A | 12/2004 |
| JP | 2006-208378 A | 8/2006 |
| JP | 2006-278946 A | 10/2006 |
| JP | 2006-294976 A | 10/2006 |
| JP | 2018-157098 A | 10/2018 |
| WO | 02/057921 A1 | 7/2002 |
| WO | 2005/022390 A1 | 3/2005 |

* cited by examiner

FIG. 3
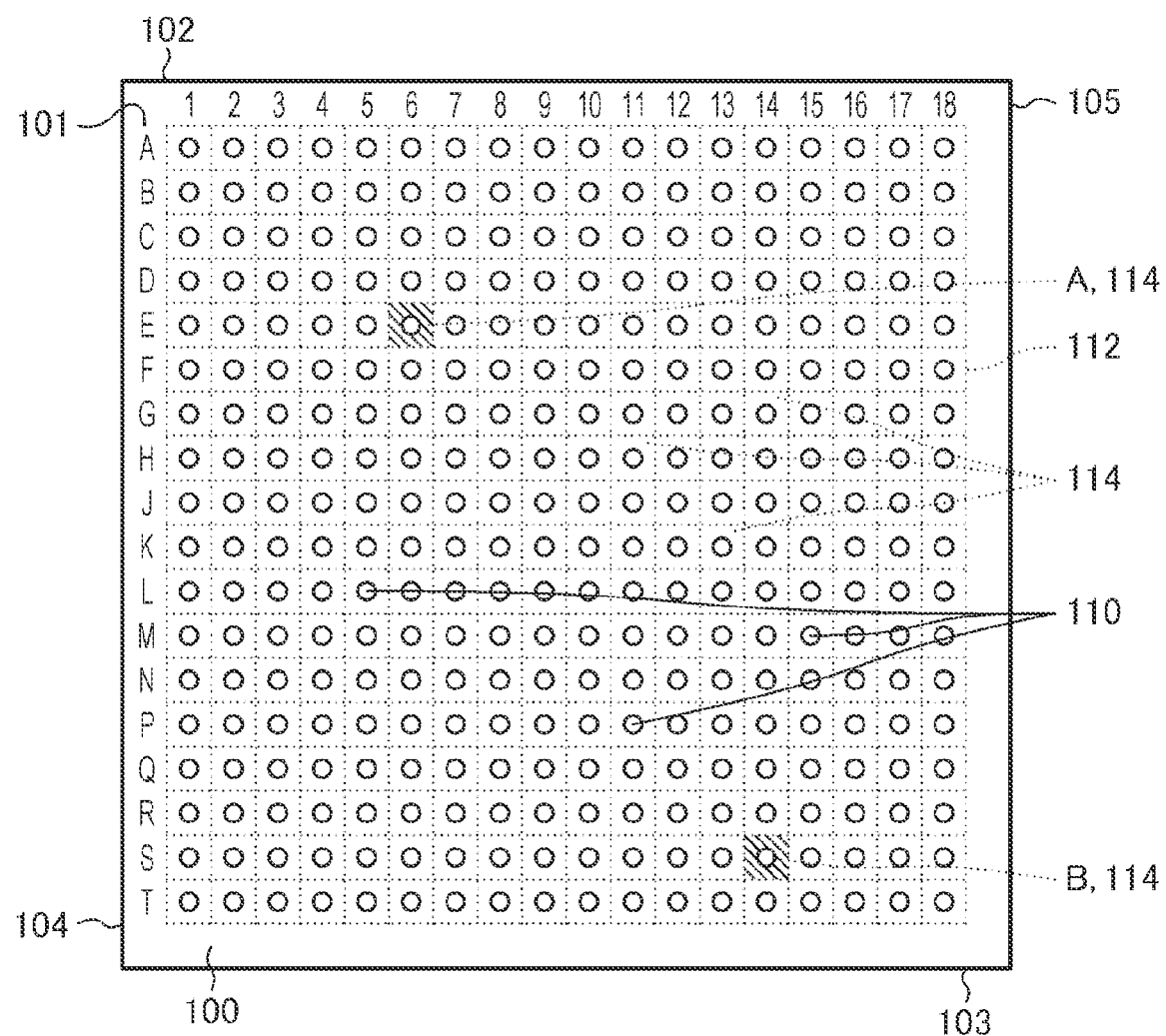
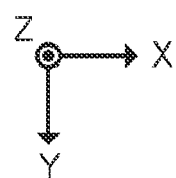

FIG. 4
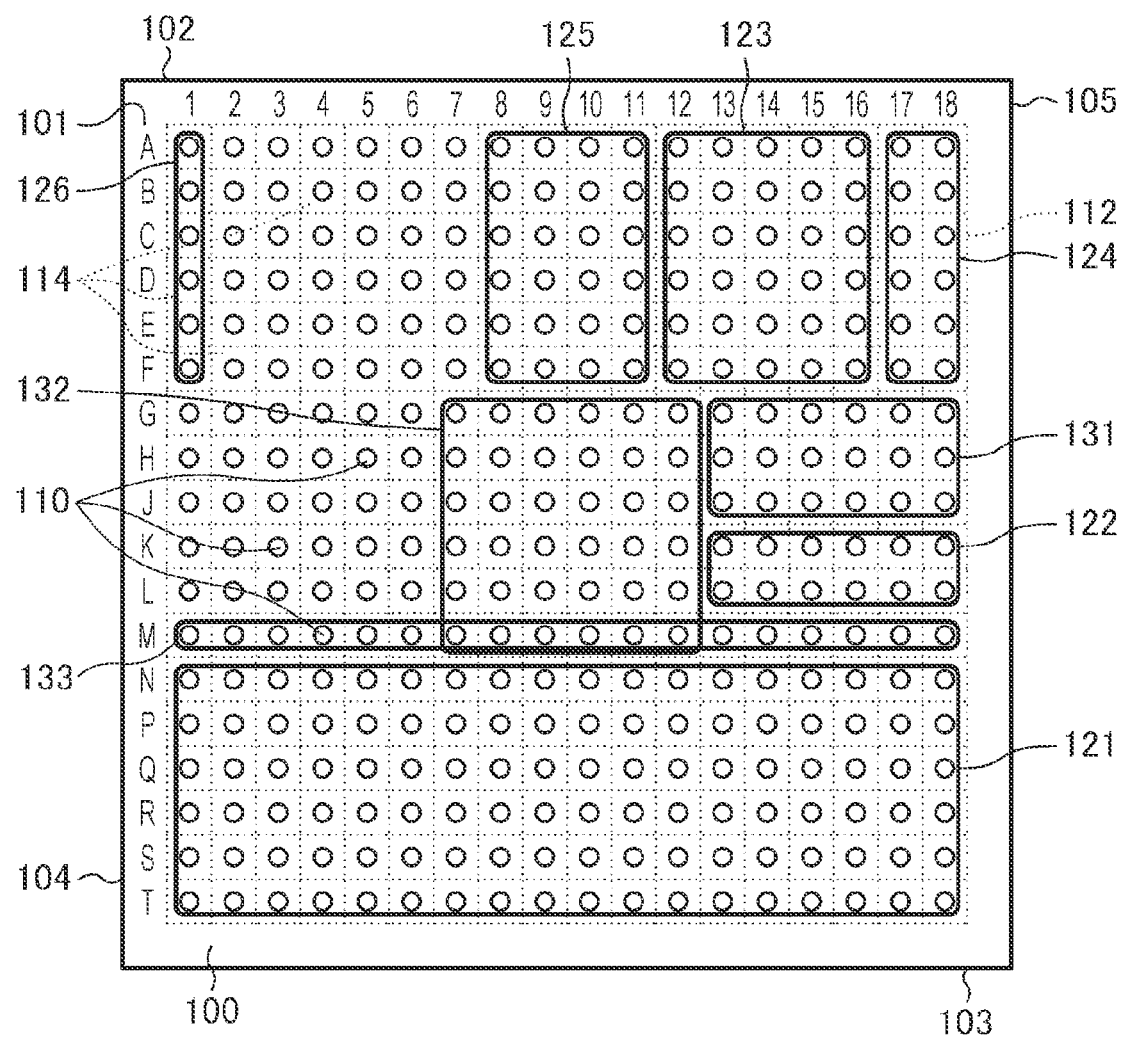
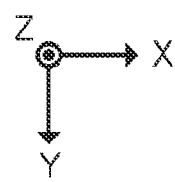

FIG. 5
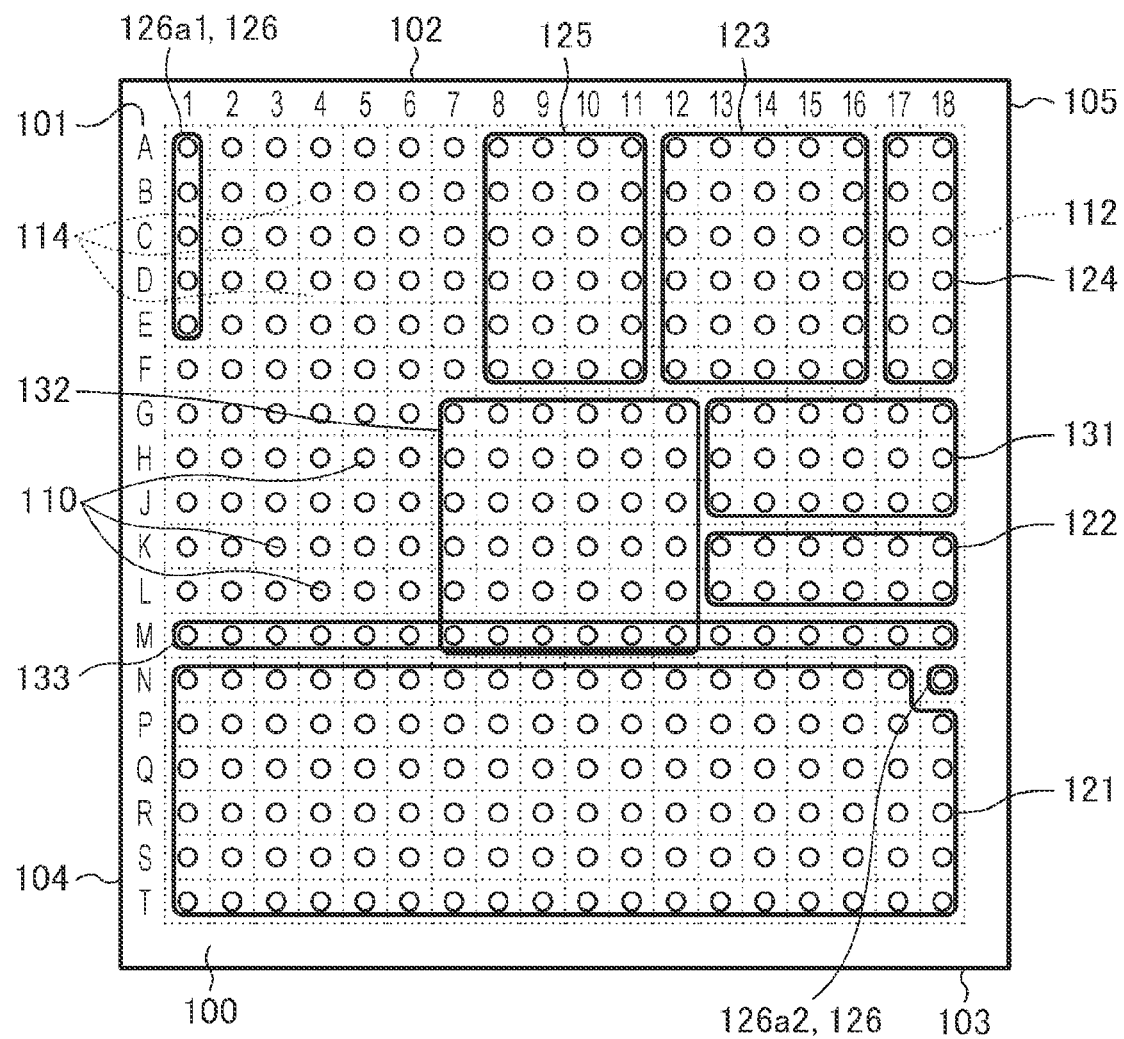
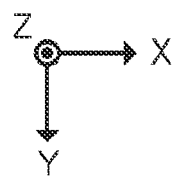

FIG. 6
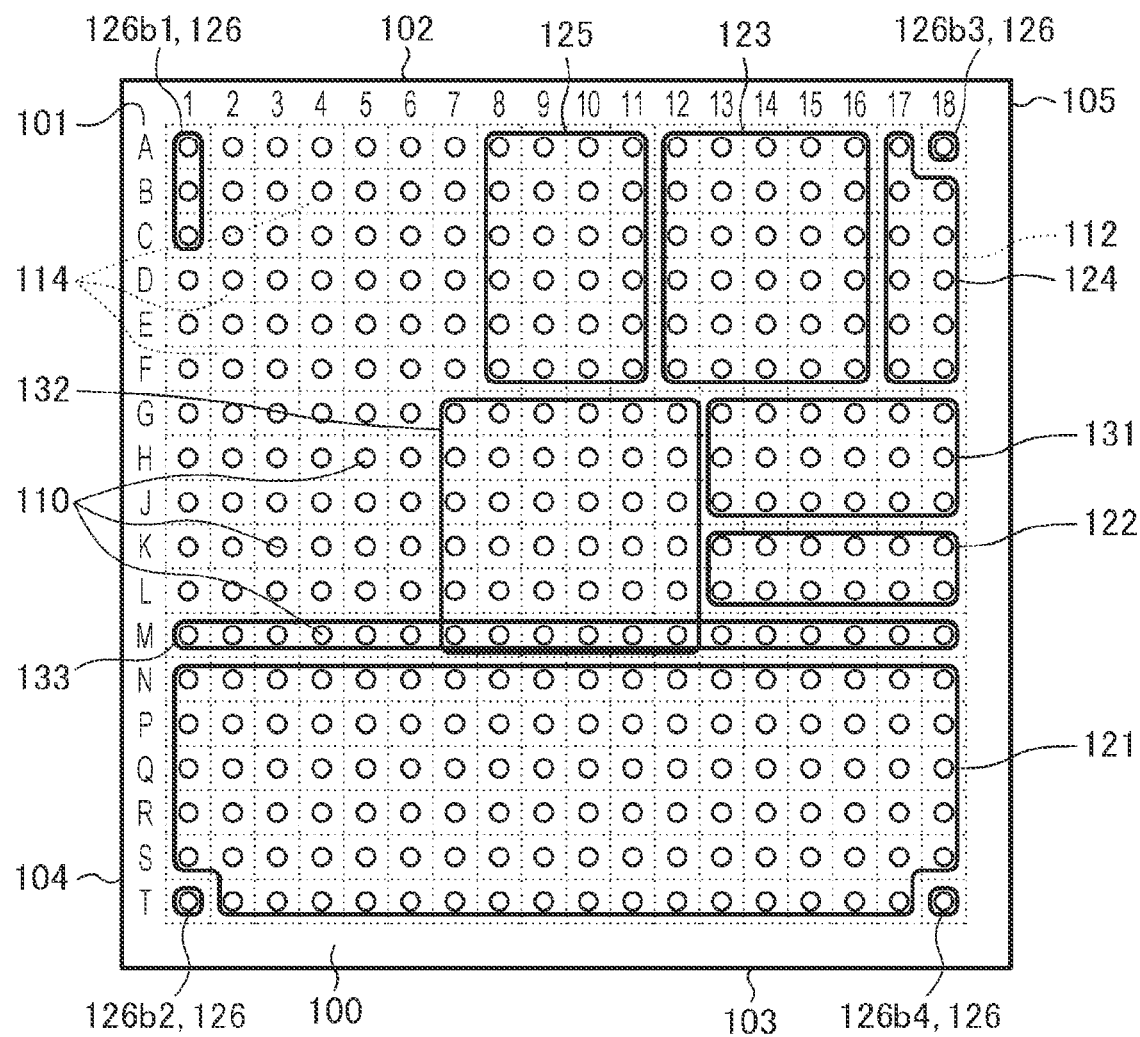
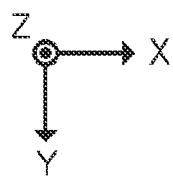

FIG. 9
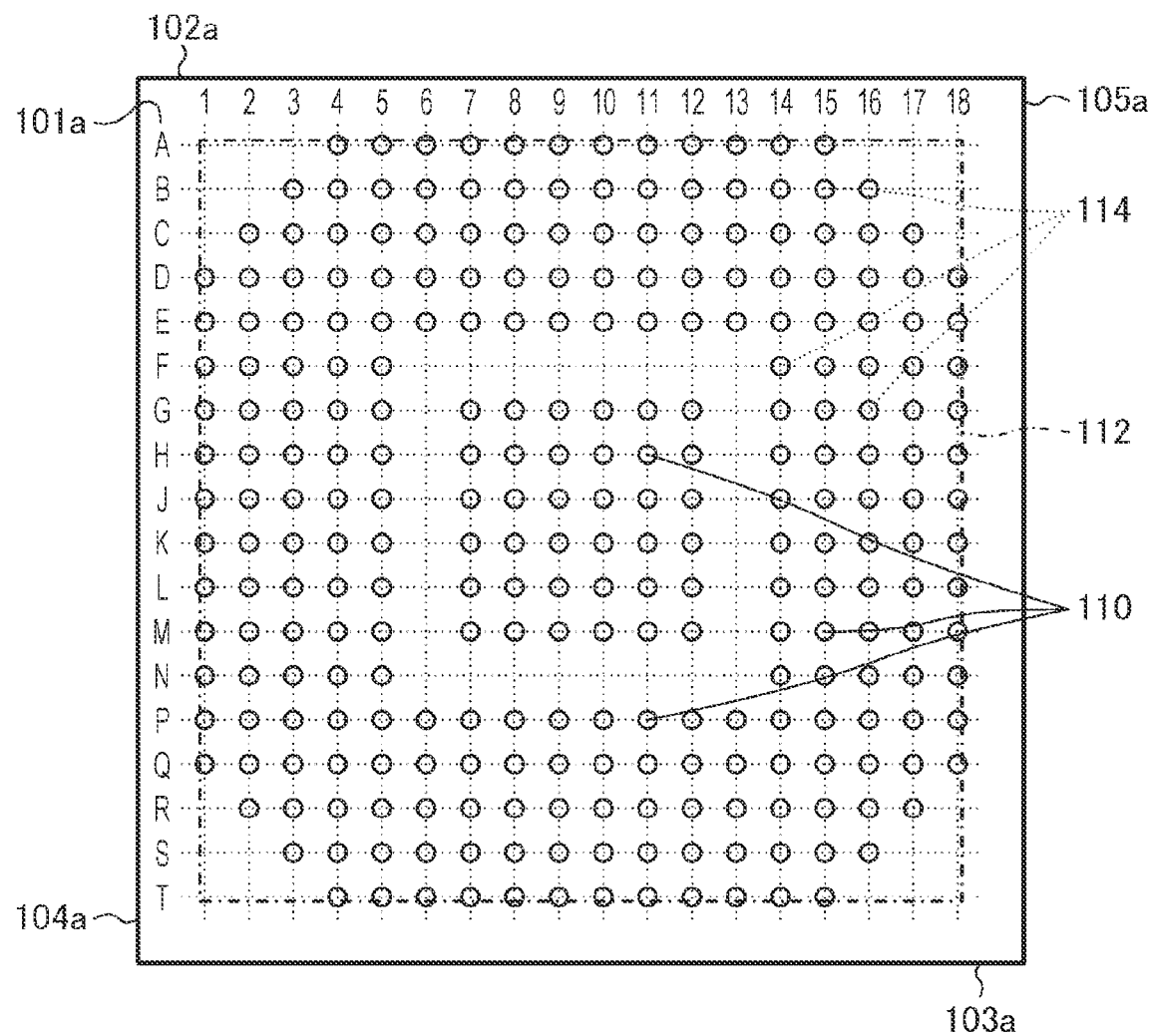
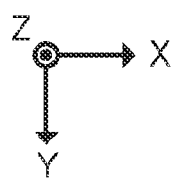

SEMICONDUCTOR APPARATUS WITH INSPECTION TERMINALS

The present application is based on, and claims priority from JP Application Serial Number 2020-031814, filed Feb. 27, 2020, the disclosure of which is hereby incorporated by reference herein in its entirety.

BACKGROUND

1. Technical Field

The present disclosure relates to a semiconductor apparatus.

2. Related Art

As semiconductor apparatuses become more integrated and highly functional, a semiconductor apparatus having many functions is widespread such as a system on chip (SoC) or a field-programmable gate array (FPGA) in which many functions are provided in one semiconductor apparatus.

The semiconductor apparatus having such many functions requires many terminals for inputting and outputting signals according to the functions, and as a result, the number of terminals provided in the semiconductor apparatus is increased. Since such an increase in the number of terminals included in the semiconductor apparatus is harmful from the viewpoint of miniaturization of the semiconductor apparatus, the terminals are arranged at a narrow pitch as the number of terminals included in the semiconductor apparatus increases. Meanwhile, when the terminals are arranged at the narrow pitch in the semiconductor apparatus, the influence of electric crosstalk or the like becomes large between the terminals, so the semiconductor apparatus may malfunction. That is, in the semiconductor apparatus having many functions, it is required to improve reliability of the semiconductor apparatus and reduce enlargement of a mounting area in which the terminals are mounted.

In response to this problem, JP-A-2006-294976 provides an additional electrode at an end portion of a substrate, and discloses a technology of reducing a possibility of an increase of a mounting area in which terminals are mounted while improving reliability of a semiconductor apparatus by using the additional electrode as an inspection terminal.

Meanwhile, since the additional electrode used as the inspection terminal in the semiconductor apparatus described in JP-A-2006-294976 is located in a ball arrangement prohibited area, which is at the end portion of the substrate, in which an electrode input or output to the semiconductor apparatus 1 such as a solder ball is not provided, there is a possibility that the additional electrode and a semiconductor chip are separated from each other. Therefore, when executing an inspection on the semiconductor apparatus by using an inspection terminal assigned to the additional electrode, there is a possibility that a wiring length between the additional electrode and an internal circuit of the semiconductor apparatus becomes long, reliability of the inspection for the semiconductor apparatus decreases, and information obtained in the inspection is limited. That is, in the semiconductor apparatus described in JP-A-2006-294976, there is room for improvement from the viewpoint of executing inspection for improving the reliability of the semiconductor apparatus having many functions.

SUMMARY

According to an aspect of the present disclosure, there is provided a semiconductor apparatus including: a memory controller; a CPU; a high-speed communication controller; a plurality of memory operation terminals for inputting a first signal propagating between an external memory group and the memory controller; a plurality of high-speed communication terminals for inputting a second signal to the high-speed communication controller; a plurality of inspection terminals for acquiring information from the CPU and performing debugging; and a terminal mounting surface at which a plurality of coupling terminals including the plurality of memory operation terminals, the plurality of high-speed communication terminals, and the plurality of inspection terminals are provided, in which the terminal mounting surface includes a first side, a second side located facing the first side, a third side intersecting both the first side and the second side, and a fourth side located facing the third side, the plurality of coupling terminals include a first terminal row located adjacent to the third side and arranged from the first side toward the second side; the first terminal row includes a first inspection terminal among the plurality of inspection terminals, and the first inspection terminal is located closest to the first side in the first terminal row.

According to another aspect of the present disclosure, there is provided a semiconductor apparatus including: a memory controller; a CPU; a high-speed communication controller; a plurality of memory operation terminals for inputting a first signal propagating between an external memory group and the memory controller; a plurality of high-speed communication terminals for inputting a second signal to the high-speed communication controller; a plurality of inspection terminals for acquiring information from the CPU and performing debugging; and a terminal mounting surface at which a plurality of coupling terminals including the plurality of memory operation terminals, the plurality of high-speed communication terminals, and the plurality of inspection terminals are provided, in which the terminal mounting surface includes a first side, a second side located facing the first side, a third side intersecting both the first side and the second side, and a fourth side located facing the third side, the plurality of coupling terminals includes a first terminal row located adjacent to the third side and arranged from the first side toward the second side, and a second terminal row located adjacent to the fourth side and arranged from the first side toward the second side, the first terminal row includes a first inspection terminal among the plurality of inspection terminals, and the second terminal row includes a second inspection terminal among the plurality of inspection terminals.

BRIEF DESCRIPTION OF THE DRAWINGS

FIG. 3 is a diagram illustrating an example of arrangement of a plurality of terminals provided at a terminal mounting surface.

FIG. 4 is a diagram illustrating an example when signals propagating at the plurality of terminals in the semiconductor apparatus are assigned to each terminal.

FIG. 5 is a diagram illustrating an example when signals propagating at a plurality of terminals in a semiconductor apparatus according to a second embodiment are assigned to each terminal.

FIG. 6 is a diagram illustrating an example when signals propagating at a plurality of terminals in a semiconductor apparatus according to a third embodiment are assigned to each terminal.

FIG. 9 is a diagram for explaining a case where a mounting area and a terminal mounting area are determined based on arrangement of the plurality of terminals provided at a terminal mounting surface.

DESCRIPTION OF EXEMPLARY EMBODIMENTS

Hereinafter, appropriate embodiments of the present disclosure will be described with reference to drawings. The used drawings are for convenience of explanation. The embodiments to be described below do not unfairly limit contents of the present disclosure described in the claims. In addition, all of configurations to be described below are not essential components of the present disclosure.

Figure 1:
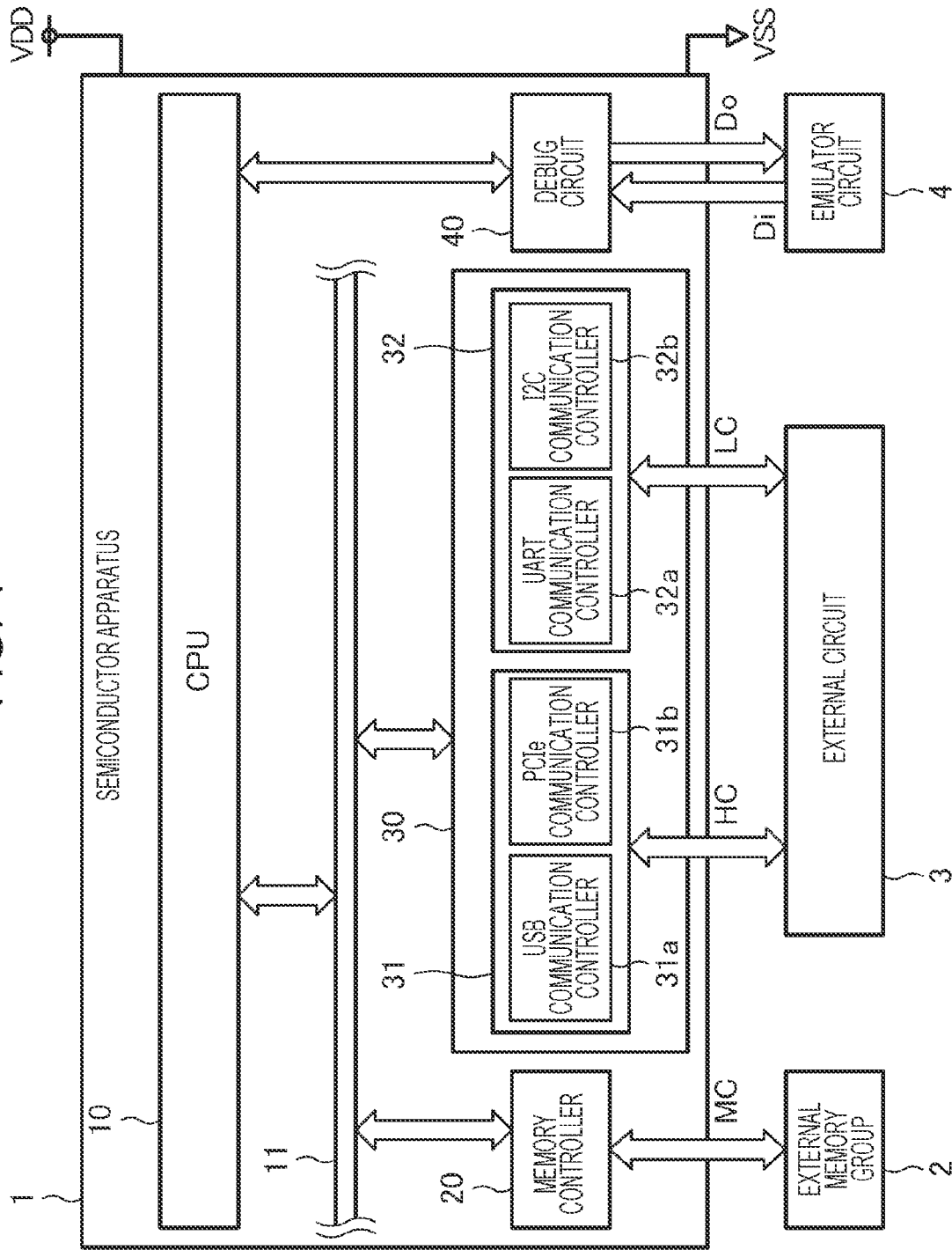
FIG. 1 is a diagram illustrating a functional configuration of a semiconductor apparatus.

1. First Embodiment 1.1 Functional Configuration of Semiconductor Apparatuses FIG. 1 is a diagram illustrating a functional configuration of a semiconductor apparatus 1. As illustrated in FIG. 1, the semiconductor apparatus 1 includes a Central Processing Unit (CPU) 10, a memory controller 20, and a communication controller 30. The CPU 10, the memory controller 20, and the communication controller 30 are communicably coupled via a bus wiring 11. Further, a voltage VDD as a power supply voltage and a voltage VSS which is a reference potential of the semiconductor apparatus 1, for example, a ground potential, are input to the semiconductor apparatus 1.

The CPU 10 is responsible for controlling the entire semiconductor apparatus 1. Specifically, the CPU 10 controls writing of information to an external memory group 2 and reading of information held by the external memory group 2 by outputting a control signal for controlling the memory controller 20.

Based on the control signal input from the CPU 10, the memory controller 20 outputs a memory control signal MC for controlling the reading of information held in the external memory group 2 provided outside the semiconductor apparatus 1 and the writing of information to the external memory group 2.

Specifically, the external memory group 2 includes a dynamic random access memory (DRAM) or a static random access memory (SRAM) provided with a plurality of memory cell circuits for holding information. When the control signal for reading the information held in the external memory group 2 is input from the CPU 10 to the memory controller 20, the memory controller 20 generates the memory control signal MC for accessing the memory cell circuit in which the information is held and outputs the memory control signal MC to the external memory group 2, according to the input control signal. That is, by using the memory control signal MC, the memory controller 20 accesses the corresponding memory cell circuit included in the external memory group 2 and reads out the information held in the memory cell circuit. The memory controller 20 outputs the information read from the external memory group 2 to the CPU 10.

Further, when a control signal for holding new information in the external memory group 2 is input from the CPU 10 to the memory controller 20, according to the input control signal, the memory controller 20 generates the memory control signal MC for accessing a memory cell circuit in which the information is held and output the memory control signal MC to the external memory group 2. That is, by using the memory control signal MC, the memory controller 20 accesses the corresponding memory cell circuit included in the external memory group 2 and causes the memory cell circuit to hold the information supplied from the CPU 10.

Here, the memory control signals MC propagating between the semiconductor apparatus 1 and the external memory group 2 may include a plurality of signals according to the number of memory cell circuits included in the external memory group 2, the amount of information held in the external memory group 2, and the like. That is, the memory control signal MC propagates via a plurality of wirings and terminals communicably coupled between the semiconductor apparatus 1 and the external memory group 2, and the semiconductor apparatus 1 includes a plurality of terminals for inputting or outputting the memory control signal MC.

Further, the CPU 10 executes a process based on the information read from the external memory group 2 via the memory controller 20, and outputs a signal according to a result of the executed process to an external circuit 3 provided outside the semiconductor apparatus 1, via the communication controller 30.

The communication controller 30 includes a high-speed communication controller 31 and a low-speed communication controller 32.

The low-speed communication controller 32 includes a circuit for generating a signal in accordance with a communication method capable of transferring data to and from the external circuit 3 using a signal having a frequency of several kHz to several MHz. The low-speed communication controller 32 converts a signal input from the CPU 10 into a signal in accordance with the communication method, and outputs the converted signal as a low-speed communication signal LC to the external circuit 3 provided outside the semiconductor apparatus 1.

As such a low-speed communication controller 32, the semiconductor apparatus 1 according to the first embodiment includes a UART communication controller 32a which controls communication in accordance with a universal asynchronous receiver/transmitter (UART) communication standard capable of transferring data at a frequency of several hundred Hz to several hundred kHz, and an I2C communication controller 32b which controls communication in accordance with an inter-integrated circuit (I2C) communication standard capable of transferring data at a frequency of several hundred kHz to several MHz. The low-speed communication controller 32 included in the semiconductor apparatus 1 may be any communication method capable of transferring data at a frequency of several kHz to several MHz, and is not limited to the UART communication controller 32a and the I2C communication controller 32*b*. Further, the low-speed communication controller 32 included in the semiconductor apparatus 1 may include the UART communication controllers 32*a* equal to or more than two, or may include the I2C communication controllers 32*b* equal to or more than two.

Here, the low-speed communication signal LC propagating between the semiconductor apparatus 1 and the external circuit 3 may include a plurality of signals according to specifications of the based communication method. That is, the low-speed communication signal LC propagates via a plurality of wirings and terminals communicably coupled between the semiconductor apparatus 1 and the external circuit 3, and the semiconductor apparatus 1 includes a plurality of terminals for inputting or outputting the low-speed communication signal LC.

The high-speed communication controller 31 controls communication capable of transferring data at a higher frequency than the low-speed communication controller 32. Specifically, the high-speed communication controller 31 includes a circuit for generating a signal in accordance with a communication method capable of transferring data to and from the external circuit 3 using a signal having a frequency equal to or more than several MHz. The high-speed communication controller 31 converts a signal input from the CPU 10 into a signal in accordance with the communication method, and outputs the converted signal as a high-speed communication signal HC to the external circuit 3 provided outside the semiconductor apparatus 1.

As such a high-speed communication controller 31, the semiconductor apparatus 1 according to the first embodiment includes a universal serial bus (USB) communication controller 31*a* which controls communication in accordance with a USB communication standard capable of transferring data at a frequency equal to or more than 12 MHz, and a peripheral component interconnect express (PCIe) communication controller 31*b* which controls PCIe communication capable of transferring data at a frequency equal to or more than several GHz. The high-speed communication controller 31 included in the semiconductor apparatus 1 may be any communication method capable of transferring data at a frequency equal to or more than several MHz, and is not limited to the USB communication controller 31*a* and the PCIe communication controller 31*b*. Further, the high-speed communication controller 31 included in the semiconductor apparatus 1 may include the USB communication controllers 31*a* equal to or more than two, or may include the PCIe communication controllers 31*b* equal to or more than two.

Here, the high-speed communication controller 31 may be any communication method capable of transferring data at a frequency equal to or more than several MHz, but is preferably a controller which controls a communication method in accordance with a communication method capable of transferring data at a high-frequency equal to or more than 5 GHz. In other words, the high-speed communication controller 31 may perform communication at a frequency equal to or more than 5 GHz. Examples of such a high-speed communication controller 31 include the USB communication controller 31*a* in accordance with a communication standard of USB 3.0 capable of transferring data at a frequency equal to or more than 5 GHz, the PCIe communication controller 31*b* described above, and the like.

As a frequency of data transfer in the high-speed communication controller 31 increases, the amount of information per unit time included in a signal output from the high-speed communication controller 31 and a signal input to the high-speed communication controller 31 increases, and the semiconductor apparatus 1 can realize more functions.

Here, the high-speed communication signal HC propagating between the semiconductor apparatus 1 and the external circuit 3 may include a plurality of signals according to specifications of the based communication method. That is, the high-speed communication signal HC propagates via a plurality of wirings and terminals communicably coupled between the semiconductor apparatus 1 and the external circuit 3, and the semiconductor apparatus 1 includes a plurality of terminals for inputting or outputting the high-speed communication signal HC.

As described above, the CPU 10 responsible for overall control of the semiconductor apparatus 1 may have a plurality of cores, include a microarchitecture which implements a command set of 64 bits or more, and be driven at a frequency equal to or more than 1.6 GHz. Here, at the CPU 10 satisfying the performance described above, a processor which inherits the functions of the ARMv7A architecture, which is expected to be used especially as an application among the ARM architectures released by ARM, for example, specifically, a processor of the ARM Cortex-A17 or later may be mounted.

The ARM Cortex-A17 has a floating point unit only (FPU) mounted inside, the number of via circuit blocks when a process is executed is reduced, as compared with the CPU in the related art in which the floating point unit only is externally mounted. Therefore, it is possible to operate at a high speed while reducing the power consumption of the semiconductor apparatus 1 when processing a large amount of data. Therefore, in the semiconductor apparatus 1 provided with the CPU 10 in which the ARM Cortex-A17 or later processor is mounted, a mounting area can be reduced while performing more processes with less power. By including the CPU 10 in which the processor of ARM Cortex-A17 or later is mounted, in the semiconductor apparatus 1 according to the present embodiment, many functions can be implemented, and even when the number of terminals for coupling the semiconductor apparatus 1 having many functions and the external device is increased, mutual interference of signals between the terminals can be reduced.

Further, the semiconductor apparatus 1 includes a debug circuit 40 for debugging the semiconductor apparatus 1. A data signal Di is input to the debug circuit 40 from an emulator circuit 4 provided externally. The debug circuit 40 generates a signal for executing debugging on the semiconductor apparatus 1 and the CPU 10 based on the input data signal Di, and outputs the signal to the CPU 10.

The CPU 10 executes a process according to the signal based on the data signal Di input from the debug circuit 40, and outputs a signal including information indicating the processing result to the debug circuit 40. After that, the debug circuit 40 generates a data signal Do according to the information input from the CPU 10 and outputs the data signal Do to the emulator circuit 4. The emulator circuit 4 determines whether or not the semiconductor apparatus 1 including the CPU 10 is normal, based on whether or not the data signal Do input from the debug circuit 40 is the signal according to the data signal Di output to the debug circuit 40.

A method for determining whether or not the semiconductor apparatus 1 including the CPU 10 is normal is preferably a method in accordance with the joint test action group (JTAG) standard. Therefore, reliability of debugging on the semiconductor apparatus 1 and the CPU 10 can be improved. The debug circuit 40 according to the first embodiment will be described as performing a test in accordance with the JTAG standard based on the data signal Di input from the emulator circuit 4.

Here, the data signals Di and Do propagating between the semiconductor apparatus 1 and the emulator circuit 4 may include a plurality of signals according to a method of debugging the semiconductor apparatus 1 and the CPU 10 to be executed. For example, when a debug to be executed on the semiconductor apparatus 1 and the CPU 10 is executed by the method in accordance with the JTAG standard described above, the data signal Di includes a plurality of signals including an input data signal input from the emulator circuit 4, a mode selection signal for selecting an inspection mode, a clock signal, and a reset signal, and the data signal Do includes a plurality of signals including an output data signal indicating a debug result. That is, the data signal Di and the data signal Do propagate via a plurality of wirings and terminals communicably coupled between the semiconductor apparatus 1 and the emulator circuit 4, and the semiconductor apparatus 1 includes a plurality of terminals for inputting or outputting the data signal Di and the data signal Do.

1.2 Structure of Semiconductor Apparatus

Figure 2:
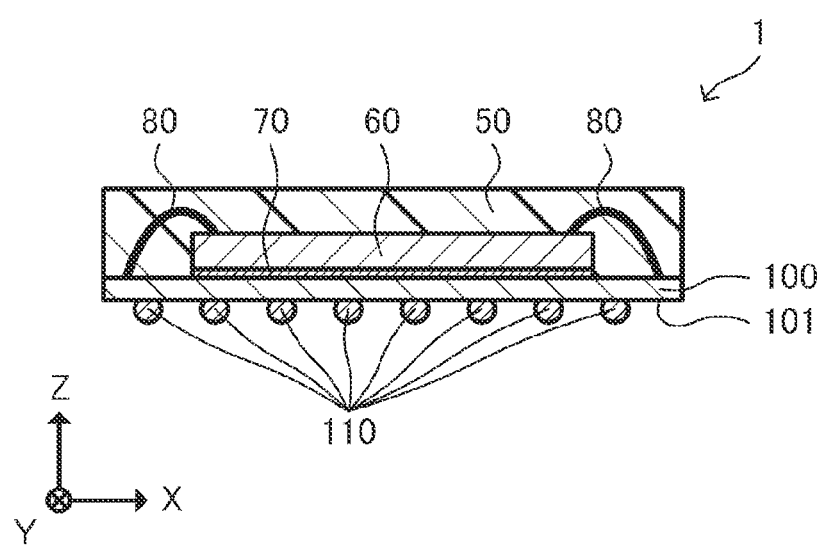
FIG. 2 is a diagram illustrating a cross-sectional structure of the semiconductor apparatus.

Next, an example of a structure of the semiconductor apparatus 1 will be described. FIG. 2 is a diagram illustrating a cross-sectional structure of the semiconductor apparatus 1. In the following description, the X-direction, the Y-direction, and the Z-direction, which are orthogonal to each other as illustrated in the drawing, will be used. Further, in some cases, a tip side in the X-direction is referred to as a +X side and a starting point side is referred to as a −X side, a tip side in the Y-direction is referred to as a +Y side and a starting point side is referred to as a −Y side, and a tip side in the Z-direction is referred to as a +Z side and a starting point side is referred to as the −Z side, as illustrated.

As illustrated in FIG. 2, the semiconductor apparatus 1 includes a printed wiring substrate 100, an IC chip 60, and a housing 50.

The CPU 10, the memory controller 20, the communication controller 30, and the debug circuit 40 described above are mounted at the IC chip 60.

The printed wiring substrate 100 is located on the −Z side of the IC chip 60. The IC chip 60 is attached to the printed wiring substrate 100 via a joining member 70 such as an adhesive. Further, the printed wiring substrate 100 and the IC chip 60 are electrically coupled via a bonding wire 80.

The printed wiring substrate 100 is provided with a plurality of wiring patterns (not illustrated) and a plurality of electrodes (not illustrated). The bonding wire 80 is electrically coupled to an electrode (not illustrated) formed at the +Z side surface of the printed wiring substrate 100. Further, the terminal 110 is provided at each of the plurality of electrodes (not illustrated) formed at a surface of the printed wiring substrate 100 on the −Z side. Each of a plurality of terminals 110 includes, for example, a solder ball. The semiconductor apparatus 1, and the external memory group 2 and the external circuit 3 provided outside the semiconductor apparatus 1 are electrically and physically coupled by the solder balls. That is, the semiconductor apparatus 1 according to the first embodiment is configured to include a so-called ball grid array (BGA) package which is electrically and mechanically coupled to the outside of the semiconductor apparatus 1 via a plurality of solder balls. Here, in the following description, a surface on the −Z side of the printed wiring substrate 100 provided with the plurality of terminals 110 is referred to as a terminal mounting surface 101.

In the semiconductor apparatus 1 configured as described above, a signal input to the semiconductor apparatus 1 via the terminal 110 provided at the terminal mounting surface 101 propagates via an electrode and a wiring pattern (not illustrated), and the bonding wire 80 provided at the printed wiring substrate 100, and input to the IC chip 60. Further, a signal output from the IC chip 60 is output to the outside of the semiconductor apparatus 1 via the bonding wire 80, the electrodes and wiring patterns (not illustrated) provided at the printed wiring substrate 100, and the terminal 110. That is, the printed wiring substrate 100 functions as an interposer substrate.

The housing 50 is located on the +Z side of the IC chip 60 and is joined to the printed wiring substrate 100 so as to cover the IC chip 60. The housing 50 contains an epoxy resin or the like to protect the IC chip 60.

1.3 Terminal Arrangement in Semiconductor Apparatuses

Next, an example of arranging the plurality of terminals 110 provided at the terminal mounting surface 101 will be described with reference to FIG. 3. FIG. 3 is a diagram illustrating an example of arrangement of the plurality of terminals 110 provided at the terminal mounting surface 101.

As illustrated in FIG. 3, the terminal mounting surface 101 includes sides 102 and 103 which are located extending in a direction along the X-direction and facing each other in a direction along the Y-direction, and sides 104 and 105 which are located extending in the direction along the Y-direction and facing each other in the direction along the X-direction. The side 104 intersects both the sides 102 and 103, and the side 105 intersects both the sides 102 and 103. That is, the terminal mounting surface 101 is configured to include the side 102, the side 103 located facing the side 102, the side 104 intersecting both the side 102 and the side 103, and the side 105 located facing the side 104, and to have a substantially rectangular shape with the sides 102 to 105 as an outer circumference. Here, the side 102 included in the terminal mounting surface 101 is an example of a first side, the side 103 is an example of a second side, the side 104 is an example of a third side, and the side 105 is an example of a fourth side.

FIG. 3 illustrates a mounting area 112 in which the terminal 110 is mounted. The mounting area 112 includes a plurality of terminal mounting areas 114 provided in a grid pattern. In the terminal mounting area 114, n sets of m terminal mounting areas 114 provided side by side in a direction along the side 102 are provided in the mounting area 112 in a direction along the side 104. That is, a total of n×m terminal mounting areas 114 are provided in the mounting area 112 of the terminal mounting surface 101. In the example illustrated in FIG. 3, 18 sets of 18 terminal mounting areas 114 provided side by side in the direction along the side 102 are illustrated as being provided in the direction along the side 104. That is, FIG. 3 illustrates a total of 324 terminal mounting areas 114.

Here, in the following description, a direction from the side 104 to the side 105 along the side 102 may be referred to as a row direction, and a direction from the side 102 to the side 103 along the side 104 may be referred to as a column direction. In the following description, among the plurality of terminal mounting areas 114, the terminal mounting area 114 located at the i-th position along the row direction and the j-th position along the column direction is referred to as the terminal mounting area 114-$ij$, in some cases. Specifically, the terminal mounting area 114 indicated as A in FIG. 3 may be referred to as a terminal mounting area 114-6E, and the terminal mounting area 114 indicated as B may be referred to as a terminal mounting area 114-14S.

Each of the plurality of terminals 110 provided at the terminal mounting surface 101 is located corresponding to each of the terminal mounting areas 114 provided in a grid pattern. Here, in the following description, the terminal 110 located in the terminal mounting area 114-*ij* may be referred to as the terminal 110-*ij*. That is, the terminal 110 located in the terminal mounting area 114-6E indicated as A in FIG. 3 may be referred to as the terminal 110-6E, and the terminal 110 located in the terminal mounting area 114-14S indicated as B may be referred to as the terminal 110-14S, in some cases. The example of the arrangement of the terminals 110 is illustrated in FIG. 3 when the terminals 110 are located in all the terminal mounting areas 114 included in the mounting area 112, but as illustrated in the third embodiment described below, the mounting area 112 may include the terminal mounting area 114 in which the terminal 110 is not located.

As described above, the plurality of terminals 110 are arranged side by side in a grid pattern at the terminal mounting surface 101. Specifically, regarding the plurality of terminals 110, 18 sets of 18 terminals 110 arranged from the side 102 toward the side 103 are provided in the direction along the side 104, at the terminal mounting surface 101. In other words, regarding the plurality of terminals 110, 18 sets of 18 terminals 110 arranged from the side 104 toward the side 105 are provided in the direction along the side 102, at the terminal mounting surface 101.

Here, the plurality of terminals 110 provided at the terminal mounting surface 101 are an example of a plurality of coupling terminals. Among the plurality of terminals 110 arranged from the side 102 toward the side 103, a terminal row including the terminals 110-1A, 110-1B, 110-1C, 110-1D, 110-1E, 110-1F, 110-1G, 110-1H, 110-1J, 110-1K, 110-1L, 110-1M, 110-1N, 110-1P, 110-1Q, 110-1R, 110-1S, and 110-1T located adjacent to the side 104 is an example of a first terminal row according to the first embodiment, among the plurality of terminals 110 arranged from the side 102 toward the side 103, a terminal row including the terminals 110-18A, 110-18B, 110-18C, 110-18D, 110-18E, 110-18F, 110-18G, 110-18H, 110-18J, 110-18K, 110-18L, 110-18M, 110-18N, 110-18P, 110-18Q, 110-18R, 110-18S, and 110-18T located adjacent to the side 105 is an example of a second terminal row according to the first embodiment, among the plurality of terminals 110 arranged from the side 104 toward the side 105, a terminal row including the terminals 110-1A to 110-18A located adjacent to the side 102 is an example of a third terminal row according to the first embodiment, and among the plurality of terminals 110 arranged from the side 104 toward the side 105, a terminal row including the terminals 110-1T to 110-18T located adjacent to the side 103 is an example of a fourth terminal row according to the first embodiment.

Here, the fact that the plurality of terminals 110 and the sides 102 to 105 of the terminal mounting surface 101 are located adjacent to each other means that the terminal mounting area 114 in which the terminal 110 can be provided is not located between the terminal mounting area 114 in which the plurality of terminals 110 are mounted and the sides 102 to 105 of the terminal mounting surface 101. That is, a terminal row located adjacent to the side 102 includes the terminal 110 located closest to the side 102 among the plurality of terminals 110 provided at the terminal mounting surface 101, a terminal row located adjacent to the side 103 includes the terminal 110 located closest to the side 103 among the plurality of terminals 110 provided at the terminal mounting surface 101, a terminal row located adjacent to the side 104 includes the terminal 110 located closest to the side 104 among the plurality of terminals 110 provided at the terminal mounting surface 101, and a terminal row located adjacent to the side 105 includes the terminal 110 located closest to the side 105 among the plurality of terminals 110 provided at the terminal mounting surface 101.

A plurality of signals including the memory control signals MC, the low-speed communication signal LC, the high-speed communication signal HC, the data signal Di, and the data signal Do propagating between the semiconductor apparatus 1 and the external memory group 2, the external circuit 3, and the emulator circuit 4, and the voltages VDD and VSS input to the semiconductor apparatus 1 propagate via each of the plurality of terminals 110 provided at the terminal mounting surface 101. Therefore, with reference to FIG. 4, a specific example of arrangement of the terminals 110 to which the various signals propagating between the semiconductor apparatus 1 and the external memory group 2, the external circuit 3, and the emulator circuit 4, and the voltages VDD and VSS are assigned is described. FIG. 4 is a diagram illustrating an example when signals propagating at the plurality of terminals 110 in the semiconductor apparatus 1 are assigned to each terminal 110.

As illustrated in FIG. 4, the terminal mounting surface 101 includes a memory operation terminal group 121 including the plurality of terminals 110 for inputting the memory control signal MC propagating between the external memory group 2 and the memory controller 20, a first high-speed communication terminal group 122 including the plurality of terminals 110 for inputting the high-speed communication signal HC to the USB communication controller 31*a* included in the high-speed communication controller 31, a second high-speed communication terminal group 123 including the plurality of terminals 110 for inputting the high-speed communication signal HC to the PCIe communication controller 31*b* included in the high-speed communication controller 31, a first low-speed communication terminal group 124 including the plurality of terminals 110 for inputting the low-speed communication signal LC to the UART communication controller 32*a* included in the low-speed communication controller 32, a second low-speed communication terminal group 125 including the plurality of terminals 110 for inputting the low-speed communication signal LC to the I2C communication controller 32*b* included in the low-speed communication controller 32, and an inspection terminal group 126 including one or the plurality of terminals 110 for acquiring information from the CPU 10 and performing debugging.

In addition, the terminal mounting surface 101 includes a CPU input and output terminal group 131 including the plurality of terminals 110 for propagating a signal input from the outside to the CPU 10, a power supply terminal group 132 including the plurality of terminals 110 for supplying the voltages VDD and VSS to the semiconductor apparatus 1, and a constant voltage terminal group 133 including the plurality of terminals 110 in which a constant voltage value is held. Here, the constant voltage value held in the constant voltage terminal group 133 according to the first embodiment is, for example, the voltage VSS of a ground potential. In other words, the voltage values of the plurality of terminals 110 included in the constant voltage terminal group 133 are held constant at a ground potential. Although the description is omitted, in addition to the plurality of terminals 110 for inputting and outputting the various signals described above, the plurality of terminals 110 for inputting clock signals, other analog signals, and other digital signals are provided in the terminal mounting surface 101.

The memory operation terminal group 121 includes the plurality of terminals 110 located in the area on the side 103 side of the terminal mounting surface 101. Specifically, the memory operation terminal group 121 includes the terminals 110-1T to 110-18T arranged in the terminal mounting areas 114-1T to 114-18T located closest on the side 103 side in the mounting area 112, the terminals 110-1S to 110-18S located in the terminal mounting areas 114-1S to 114-18S located adjacent to each of the terminal mounting areas 114-1T to 114-18T on the −Y side, the terminals 110-1R to 110-18R located in the terminal mounting areas 114-1R to 114-18R located adjacent to each of the terminal mounting areas 114-1S to 114-18S on the −Y side, the terminals 110-1Q to 110-18Q located in the terminal mounting areas 114-1Q to 114-18Q located adjacent to each of the terminal mounting areas 114-1R to 114-18R on the −Y side, the terminals 110-1P to 110-18P located in the terminal mounting areas 114-1P to 114-18P located adjacent to each of the terminal mounting areas 114-1Q to 114-18Q on the −Y side, and the terminals 110-1N to 110-18N located in the terminal mounting areas 114-1N to 114-18N located adjacent to each of the terminal mounting areas 114-1P to 114-18P on the −Y side, among the plurality of terminal mounting areas 114 included in the mounting area 112.

The memory control signal MC propagating between the corresponding memory cell circuit included in the external memory group 2 and the memory controller 20 propagates to each of the plurality of terminals 110 included in the memory operation terminal group 121. The memory operation terminal group 121 may include the terminal 110 which holds a constant voltage based on the voltage VDD and the terminal 110 which holds the voltage VSS which is a ground potential.

Here, the terminals 110-1N to 110-18N, 110-1P to 110-18P, 110-1Q to 110-18Q, 110-1R to 110-18R, 110-1S to 110-18S, and 110-1T to 110-18T, which are the plurality of terminals 110 included in the memory operation terminal group 121 are examples of a plurality of memory operation terminals, and the memory control signal MC propagating between the external memory group 2 and the memory controller 20 via the plurality of terminals 110 included in the memory operation terminal group 121 is an example of a first signal.

The constant voltage terminal group 133 includes the plurality of terminals 110 located in the area on the side 102 side of the memory operation terminal group 121. Specifically, the constant voltage terminal group 133 includes the terminals 110-1M to 110-18M located in the terminal mounting areas 114-1M to 114-18M, among the plurality of terminal mounting areas 114 included in the mounting area 112. Each of the terminals 110-1M to 110-18M included in the constant voltage terminal group 133 holds the voltage VSS having a constant voltage value at a ground potential. Therefore, the constant voltage terminal group 133 functions as a shield terminal for reducing the influence of noise on the memory operation terminal group 121 and reducing the possibility that the noise generated in the memory operation terminal group 121 is emitted.

The first high-speed communication terminal group 122 is an area on the side 102 side of the constant voltage terminal group 133 located side by side along the row direction, and includes the plurality of terminals 110 located in an area on the side 105 side of the terminal mounting surface 101. Specifically, the first high-speed communication terminal group 122 includes the terminals 110-13L to 110-18L located in the terminal mounting areas 114-13L to 114-18L and the terminals 110-13K to 110-18K located in the terminal mounting areas 114-13K to 114-18K, among the plurality of terminal mounting areas 114 included in the mounting area 112.

A plurality of signals in accordance with the USB communication standard propagating between the USB communication controller 31a included in the high-speed communication controller 31 and the external circuit 3 are input to each of the plurality of terminals 110 included in the first high-speed communication terminal group 122 as the high-speed communication signal HC. In other words, a USB communication signal for performing USB communication propagates as the high-speed communication signal HC to each of the plurality of terminals 110 included in the first high-speed communication terminal group 122. At least one of the terminals 110-13L to 110-18L and 110-13K to 110-18K included in the first high-speed communication terminal group 122 is an example of a first high-speed communication terminal. The first high-speed communication terminal group 122 may include the terminal 110 which holds a constant voltage based on the voltage VDD and the terminal 110 which holds the voltage VSS which is a ground potential.

The CPU input and output terminal group 131 includes the plurality of terminals 110 located in an area on the side 102 side of the first high-speed communication terminal group 122. Specifically, among the plurality of terminal mounting areas 114 included in the mounting area 112, the CPU input and output terminal group 131 includes the terminals 110-13G to 110-18G, 110-13H to 110-18H, and 110-13J to 110-18J which are respectively located in the terminal mounting areas 114-13G to 114-18G, 114-13H to 114-18H, and 114-13J to 114-18J. The CPU input and output terminal group 131 may include the terminal 110 which holds a constant voltage based on the voltage VDD and the terminal 110 which holds the voltage VSS which is a ground potential.

A control signal input to the CPU 10 and a signal output from the CPU 10 to the outside of the semiconductor apparatus 1 propagate to each of the plurality of terminals 110 included in the CPU input and output terminal group 131.

The power supply terminal group 132 includes the plurality of terminals 110 located in an area on the side 104 side of the first high-speed communication terminal group 122 and the CPU input and output terminal group 131. Specifically, among the plurality of terminal mounting areas 114 included in the mounting area 112, the power supply terminal group 132 includes the terminals 110-7G to 110-12G, 110-7H to 110-12H, 110-7J to 110-12J, 110-7K to 110-12K, 110-7L to 110-12L, and 110-7M to 110-12M which are respectively located in the terminal mounting areas 114-7G to 114-12G, 114-7H to 114-12H, 114-7J to 114-12J, 114-7K to 114-12K, 114-7L to 114-12L, and 114-7M to 114-12M.

The voltage VDD as a power supply voltage of the semiconductor apparatus 1 and the voltage VSS as a reference potential of the semiconductor apparatus 1 are input to each of the plurality of terminals 110 included in the power supply terminal group 132.

The first low-speed communication terminal group 124 includes the plurality of terminals 110 located in an area, which is an area on the side 102 side of the CPU input and output terminal group 131, on the side 105 side of the terminal mounting surface 101. Specifically, among the plurality of terminal mounting areas 114 included in the mounting area 112, the first low-speed communication terminal group 124 includes the terminals 110-17A, 110-18A, 110-17B, 110-18B, 110-17C, 110-18C, 110-17D, 110-18D, 110-17E, 110-18E, 110-17F, and 110-18F which are respectively located in the terminal mounting areas 114-17A, 114-18A, 114-17B, 114-18B, 114-17C, 114-18C, 114-17D, 114-18D, 114-17E, 114-18E, 114-17F, and 114-18F.

A plurality of signals in accordance with the UART communication standard propagating between the UART communication controller 32a included in the low-speed communication controller 32 and the external circuit 3 are input to each of the plurality of terminals 110 included in the first low-speed communication terminal group 124 as the low-speed communication signal LC. The first low-speed communication terminal group 124 may include the terminal 110 which holds a constant voltage based on the voltage VDD and the terminal 110 which holds the voltage VSS which is a ground potential.

The second high-speed communication terminal group 123 includes the plurality of terminals 110 located in an area, which is an area on the side 102 side of the power supply terminal group 132 and the CPU input and output terminal group 131, on the side 104 side of the first low-speed communication terminal group 124. Specifically, among the plurality of terminal mounting areas 114 included in the mounting area 112, the second high-speed communication terminal group 123 includes the terminals 110-12A to 110-16A, 110-12B to 110-16B, 110-12C to 110-16C, 110-12D to 110-16D, 110-12E to 110-16E, and 110-12F to 110-16F which are respectively located in the terminal mounting areas 114-12A to 114-16A, 114-12B to 114-16B, 114-12C to 114-16C, 114-12D to 114-16D, 114-12E to 114-16E, and 114-12F to 114-16F.

A plurality of signals in accordance with the PCIe communication standard propagating between the PCIe communication controller 31b included in the high-speed communication controller 31 and the external circuit 3 are input to each of the plurality of terminals 110 included in the second high-speed communication terminal group 123 as the high-speed communication signal HC. In other words, a PCIe communication signal for performing PCIe communication propagates as the high-speed communication signal HC to each of the plurality of terminals 110 included in the second high-speed communication terminal group 123. At least one of the terminals 110-12A to 110-16A, 110-12B to 110-16B, 110-12C to 110-16C, 110-12D to 110-16D, 110-12E to 110-16E, and 110-12F to 110-16F included in the second high-speed communication terminal group 123 is an example of a second high-speed communication terminal. The second high-speed communication terminal group 123 may include the terminal 110 which holds a constant voltage based on the voltage VDD and the terminal 110 which holds the voltage VSS which is a ground potential.

The second low-speed communication terminal group 125 includes the plurality of terminals 110 located in an area, which is an area on the side 102 side of the power supply terminal group 132, on the side 104 side of the second high-speed communication terminal group 123. Specifically, among the plurality of terminal mounting areas 114 included in the mounting area 112, the second low-speed communication terminal group 125 includes the terminals 110-7A to 110-10A, 110-7B to 110-10B, 110-7C to 110-10C, 110-7D to 110-10D, 110-7E to 110-10E, and 110-7F to 110-10F which are respectively located in the terminal mounting areas 114-7A to 114-10A, 114-7B to 114-10B, 114-7C to 114-10C, 114-7D to 114-10D, 114-7E to 114-10E, and 114-7F to 114-10F.

A plurality of signals in accordance with the I2C communication standard propagating between the I2C communication controller 32b included in the low-speed communication controller 32 and the external circuit 3 are input to each of the plurality of terminals 110 included in the second low-speed communication terminal group 125 as the low-speed communication signal LC. The second low-speed communication terminal group 125 may include the terminal 110 which holds a constant voltage based on the voltage VDD and the terminal 110 which holds the voltage VSS which is a ground potential.

The inspection terminal group 126 includes the plurality of terminals 110 located in the vicinity of the side 102, among the plurality of terminals 110 located side by side along the side 104 of the terminal mounting surface 101. Specifically, the inspection terminal group 126 includes the terminals 110-1A, 110-1B, 110-1C, 110-1D, 110-1E, and 110-1F located in the terminal mounting areas 114-1A, 114-1B, 114-1C, 114-1D, 114-1E, and 114-1F, among the plurality of terminal mounting areas 114 included in the mounting area 112. That is, among the plurality of terminals 110 arranged from the side 102 toward the side 103, the terminal row including the terminals 110-1A, 110-1B, 110-1C, 110-1D, 110-1E, 110-1F, 110-1G, 110-1H, 110-1J, 110-1K, 110-1L, 110-1M, 110-1N, 110-1P, 110-1Q, 110-1R, 110-1S, and 110-1T located adjacent to the side 104 includes the terminals 110-1A, 110-1B, 110-1C, 110-1D, 110-1E, and 110-1F included in the inspection terminal group 126. The terminal 110-1A included in the inspection terminal group 126 is located closest to the side 102, in the terminal row including the terminals 110-1A, 110-1B, 110-1C, 110-1D, 110-1E, 110-1F, 110-1G, 110-1H, 110-1J, 110-1K, 110-1L, 110-1M, 110-1N, 110-1P, 110-1Q, 110-1R, 110-1S, and 110-1T located adjacent to the side 104.

Here, the terminals 110-1A, 110-1B, 110-1C, 110-1D, 110-1E, and 110-1F included in the inspection terminal group 126 are examples of a plurality of inspection terminals, and the terminal 110-1A located closest to the side 102 in the terminal row including the terminals 110-1A, 110-1B, 110-1C, 110-1D, 110-1E, 110-1F, 110-1G, 110-1H, 110-1J, 110-1K, 110-1L, 110-1M, 110-1N, 110-1P, 110-1Q, 110-1R, 110-1S, and 110-1T among the plurality of terminals 110 included in the inspection terminal group 126 is an example of a first inspection terminal of the semiconductor apparatus 1 according to the first embodiment.

The data signals Di and Do are input to each of the terminals 110-1A, 110-1B, 110-1C, 110-1D, 110-1E, and 110-1F included in the inspection terminal group 126, as signals for executing debugging in accordance with the JTAG standard. That is, the inspection terminal group 126 includes the terminals 110-14M to 110-18M to which a signal for executing a test in accordance with the JTAG standard as the debugging is input.

Here, in an example in which signals propagating at the plurality of terminals 110 in the semiconductor apparatus 1 according to the first embodiment illustrated in FIG. 4 are assigned to each terminal 110, each of the terminals 110-1A, 110-1B, 110-1C, 110-1D, 110-1E, and 110-1F included in the inspection terminal group 126 is arranged side by side along the side 104, and at least one of the plurality of terminals 110 included in the inspection terminal group 126 may be arranged in the terminal mounting area 114-A1, and arrangement of the other terminals 110 among the plurality of terminals 110 included in the inspection terminal group 126 is not limited to the arrangement illustrated in FIG. 4.

Here, at least one of the terminals 110-13L to 110-18L and 110-13K to 110-18K for the USB communication controller 31a included in the high-speed communication controller 31 or at least one of the terminals 110-12A to 110-16A, 110-12B to 110-16B, 110-12C to 110-16C, 110-12D to 110-16D, 110-12E to 110-16E, and 110-12F to 110-16F for the PCIe communication controller 31*b* are examples of a plurality of high-speed communication terminals, and the high-speed communication signal HC to be input via at least one of the terminals 110-13L to 110-18L, and 110-13K to 110-18K for the USB communication controller 31*a* or at least one of the terminals 110-12A to 110-16A, 110-12B to 110-16B, 110-12C to 110-16C, 110-12D to 110-16D, 110-12E to 110-16E, and 110-12F to 110-16F for the PCIe communication controller 31*b* included in the high-speed communication controller 31 is an example of a second signal.

The number and arrangement of terminals 110 included in each of the memory operation terminal group 121, the first high-speed communication terminal group 122, the second high-speed communication terminal group 123, the first low-speed communication terminal group 124, the second low-speed communication terminal group 125, the CPU input and output terminal group 131, the power supply terminal group 132, and the constant voltage terminal group 133 are not limited to the number and arrangement of terminals 110 illustrated in FIG. 4.

1.4 Action and Effect

In the semiconductor apparatus 1 according to the first embodiment configured as described above, the terminal mounting surface 101 in which the plurality of terminals 110 are provided includes the side 102, the side 103 located facing the side 102, and the side 104 intersecting both the side 102 and the side 103, and at least one of the plurality of terminals 110 included in the inspection terminal group 126 for acquiring information from the CPU 10 and performing debugging among the plurality of terminals 110 is adjacent to the side 104 of the terminal mounting surface 101, and is located closest on the side 102 side among the plurality of terminals 110 provided side by side along a direction from the side 102 to the side 103. That is, at least one of the plurality of terminals 110 included in the inspection terminal group 126 is located in the vicinity of a corner portion at which the side 102 and the side 104 intersect at the terminal mounting surface 101.

A dicing step or the like performed when the semiconductor apparatus 1 is manufactured may cause damage such as chipping or cracking in the semiconductor apparatus 1. Such damage is likely to occur at an end portion of the semiconductor apparatus 1 or at the corner portion of the terminal mounting surface 101. In the semiconductor apparatus 1 according to the first embodiment, by arranging at least one of the plurality of terminals included in the inspection terminal group 126 at the corner portion of the terminal mounting surface 101, it is possible to improve detection accuracy of whether or not the semiconductor apparatus 1 is damaged such as chipped or cracked.

Further, when the semiconductor apparatus 1 is mounted on an external substrate or the like, there is a possibility that a mounting position of the semiconductor apparatus 1 is displaced and mounting deviation occurs. Such mounting deviation becomes more remarkable at the end portion of the terminal mounting surface 101 of the semiconductor apparatus 1. In the semiconductor apparatus 1 according to the first embodiment, at least one of the plurality of terminals included in the inspection terminal group 126 is located at the corner portion of the terminal mounting surface 101, so that it is possible to improve the detection accuracy of mounting deviation which occurs when the semiconductor apparatus 1 is mounted on the external substrate or the like.

Further, in the semiconductor apparatus 1 according to the first embodiment, the plurality of terminals 110 included in the inspection terminal group 126 are provided at the terminal mounting surface 101 together with the plurality of terminals 110 for propagating the memory control signal MC to the semiconductor apparatus 1 and the plurality of terminals 110 for propagating the high-speed communication signal HC for performing high-speed communication between the semiconductor apparatus 1 and the outside. That is, the inspection terminal group 126 including the plurality of terminals 110 for debugging the semiconductor apparatus 1 can be provided in the vicinity of a circuit for executing each function of the semiconductor apparatus 1, which is the vicinity of the terminal 110 electrically coupled to the circuit. Therefore, when debugging is executed on the semiconductor apparatus 1 via the plurality of terminals 110 included in the inspection terminal group 126, a possibility that an internal wiring of the semiconductor apparatus 1 affects the signal for debugging is reduced. As a result, reliability of debugging on the semiconductor apparatus 1 is improved. That is, in the semiconductor apparatus 1 according to the first embodiment, reliability of the semiconductor apparatus 1 can be improved.

As described above, in the semiconductor apparatus 1 according to the first embodiment, at least one of the plurality of terminals 110 for debugging the semiconductor apparatus 1 is arranged in the vicinity of the corner portion intersecting the side 102 and the side 104 at the terminal mounting surface 101, so that it is possible to execute an inspection for improving the reliability of the semiconductor apparatus 1 having many functions.

2. Second Embodiment

Next, the semiconductor apparatus 1 according to a second embodiment will be described. In description of the semiconductor apparatus 1 according to the second embodiment, the same components as those in the semiconductor apparatus 1 according to the first embodiment are designated by the same reference numerals, and the description is omitted or simplified, in some cases. In the semiconductor apparatus 1 according to the second embodiment, arrangement of the plurality of terminals 110 included in the inspection terminal group 126 is different from that of the semiconductor apparatus 1 according to the first embodiment.

FIG. 5 is a diagram illustrating an example when signals propagating at the plurality of terminals 110 in the semiconductor apparatus 1 according to the second embodiment are assigned to each terminal 110. As illustrated in FIG. 5, in the semiconductor apparatus 1 according to the second embodiment, some terminals among the plurality of terminals 110 included in the inspection terminal group 126 are located adjacent to the side 104 of the terminal mounting surface 101, and other terminals among the plurality of terminals 110 included in the inspection terminal group 126 are located adjacent to the side 105 of the terminal mounting surface 101.

Here, in FIG. 5, in the semiconductor apparatus 1 according to the second embodiment, the inspection terminal group 126 including the terminal 110 located adjacent to the side 104 among the plurality of terminals 110 included in the inspection terminal group 126 is illustrated as an inspection terminal group 126*a*1, and the inspection terminal group 126 including the terminal 110 located adjacent to the side 105 among the plurality of terminals 110 included in the inspection terminal group 126 is illustrated as an inspection terminal group 126*a*2.

As illustrated in FIG. 5, the terminals 110-1A, 110-1B, 110-1C, 110-1D, and 110-1E included in the inspection terminal group 126a1 are included in the terminal row including the terminals 110-1A, 110-1B, 110-1C, 110-1D, 110-1E, 110-1F, 110-1G, 110-1H, 110-1J, 110-1K, 110-1L, 110-1M, 110-1N, 110-1P, 110-1Q, 110-1R, 110-1S, and 110-1T located adjacent to the side 104 among the plurality of terminals 110 arranged from the side 102 toward the side 103, and the terminal 110-18N included in the inspection terminal group 126a2 is included in the terminal row including the terminals 110-18A, 110-18B, 110-18C, 110-18D, 110-18E, 110-18F, 110-18G, 110-18H, 110-18J, 110-18K, 110-18L, 110-18M, 110-18N, 110-18P, 110-18Q, 110-18R, 110-18S, and 110-18T located adjacent to the side 105 among the plurality of terminals 110 arranged from the side 102 toward the side 103.

That is, in the semiconductor apparatus 1 according to the second embodiment, some of the plurality of terminals 110 included in the inspection terminal group 126 and some different terminals 110 among the plurality of terminals 110 included in the inspection terminal group 126 are provided in the vicinity of the opposite sides of the terminal mounting surface 101.

As described above, in the dicing step or the like performed when manufacturing the semiconductor apparatus 1, damage such as chipping or cracking in the semiconductor apparatus 1 is likely to occur toward the end portion of the semiconductor apparatus 1, and mounting deviation which occurs when the semiconductor apparatus 1 is mounted on the external substrate or the like becomes more remarkable at the end portion of the terminal mounting surface 101 of the semiconductor apparatus 1. In the semiconductor apparatus 1 according to the second embodiment, in the same manner as in the first embodiment, the plurality of terminals 110 included in the inspection terminal group 126 are provided at the terminal mounting surface 101 together with the plurality of terminals 110 for propagating the memory control signal MC to the semiconductor apparatus 1 and the plurality of terminals 110 for propagating the high-speed communication signal HC for performing high-speed communication between the semiconductor apparatus 1 and the outside.

Therefore, with the semiconductor apparatus 1 according to the second embodiment, it is also possible to execute an inspection for improving the reliability of the semiconductor apparatus 1 having many functions, in the same manner as the semiconductor apparatus 1 described in the first embodiment.

Here, among the plurality of terminals 110 arranged from the side 102 toward the side 103, the terminal row including the terminals 110-1A, 110-1B, 110-1C, 110-1D, 110-1E, 110-1F, 110-1G, 110-1H, 110-1J, 110-1K, 110-1L, 110-1M, 110-1N, 110-1P, 110-1Q, 110-1R, 110-1S, and 110-1T located adjacent to the side 104 is an example of a first terminal row according to the second embodiment, any one of the terminals 110-1A, 110-1B, 110-1C, 110-1D, and 110-1E included in the first terminal row and included in the inspection terminal group 126a1 is an example of a first inspection terminal according to the second embodiment, among the plurality of terminals 110 arranged from the side 102 toward the side 103, the terminal row including the terminals 110-18A, 110-18B, 110-18C, 110-18D, 110-18E, 110-18F, 110-18G, 110-18H, 110-18J, 110-18K, 110-18L, 110-18M, 110-18N, 110-18P, 110-18Q, 110-18R, 110-18S, and 110-18T located adjacent to the side 105 is an example of a second terminal row according to the second embodiment, and the terminal 110-18N included in the second terminal row and included in the inspection terminal group 126a2 is an example of a second inspection terminal according to the second embodiment.

3. Third Embodiment

Next, the semiconductor apparatus 1 according to a third embodiment will be described. In description of the semiconductor apparatus 1 according to the third embodiment, the same components as those in the semiconductor apparatus 1 according to the first embodiment and the second embodiment are designated by the same reference numerals, and the description is omitted or simplified, in some cases. In the semiconductor apparatus 1 according to the third embodiment, arrangement of the plurality of terminals 110 included in the inspection terminal group 126 is different from that of the semiconductor apparatus 1 according to the first embodiment and the second embodiment.

FIG. 6 is a diagram illustrating an example when signals propagating at the plurality of terminals 110 in the semiconductor apparatus 1 according to the third embodiment are assigned to each terminal 110. As illustrated in FIG. 6, in the semiconductor apparatus 1 according to the third embodiment, some terminals among the plurality of terminals 110 included in the inspection terminal group 126 are located adjacent to the side 104 of the terminal mounting surface 101, and other terminals among the plurality of terminals 110 included in the inspection terminal group 126 are located adjacent to the side 105 of the terminal mounting surface 101. One of the plurality of terminals 110 included in the inspection terminal group 126 located adjacent to the side 104 of the terminal mounting surface 101 is located in the vicinity of the side 102, one of the plurality of terminals 110 included in the inspection terminal group 126 located adjacent to the side 104 of the terminal mounting surface 101 is located in the vicinity of the side 103, one of the plurality of terminals 110 included in the inspection terminal group 126 located adjacent to the side 105 of the terminal mounting surface 101 is located in the vicinity of the side 102, and one of the plurality of terminals 110 included in the inspection terminal group 126 located adjacent to the side 105 of the terminal mounting surface 101 is located in the vicinity of the side 103.

Here, in FIG. 6, among the plurality of terminals 110 included in the inspection terminal group 126, the inspection terminal group 126 including the terminals 110 located adjacent to the side 104 of the terminal mounting surface 101 and located in the vicinity of the side 102 is illustrated as an inspection terminal group 126b1, among the plurality of terminals 110 included in the inspection terminal group 126, the inspection terminal group 126 including the terminal 110 located adjacent to the side 104 of the terminal mounting surface 101 and located in the vicinity of the side 103 is illustrated as an inspection terminal group 126b2, among the plurality of terminals 110 included in the inspection terminal group 126, the inspection terminal group 126 including the terminal 110 located adjacent to the side 105 of the terminal mounting surface 101 and located in the vicinity of the side 102 is illustrated as an inspection terminal group 126b3, and among the plurality of terminals 110 included in the inspection terminal group 126, the inspection terminal group 126 including the terminal 110 located adjacent to the side 105 of the terminal mounting surface 101 and located in the vicinity of the side 103 is illustrated as an inspection terminal group 126b4.

In the semiconductor apparatus 1 according to the third embodiment, the terminals 110-1A, 110-1B, and 110-1C included in the inspection terminal group 126b1 and the terminal 110-1T included in the inspection terminal group 126b2 are included in the terminal row including the terminals 110-1A, 110-1B, 110-1C, 110-1D, 110-1E, 110-1F, 110-1G, 110-1H, 110-1J, 110-1K, 110-1L, 110-1M, 110-1N, 110-1P, 110-1Q, 110-1R, 110-1S, and 110-1T located adjacent to the side 104 among the plurality of terminals 110 arranged from the side 102 toward the side 103, and the terminal 110-18A included in the inspection terminal group 126b3 and the terminal 110-18T included in the inspection terminal group 126b4 are included in the terminal row including the terminals 110-18A, 110-18B, 110-18C, 110-18D, 110-18E, 110-18F, 110-18G, 110-18H, 110-18J, 110-18K, 110-18L, 110-18M, 110-18N, 110-18P, 110-18Q, 110-18R, 110-18S, and 110-18T located adjacent to the side 105 among the plurality of terminals 110 arranged from the side 102 toward the side 103.

The terminal 110-1A among the terminals 110-1A, 110-1B, and 110-1C included in the inspection terminal group 126b1 is located closest to the side 102 in the terminal row including the terminals 110-1A, 110-1B, 110-1C, 110-1D, 110-1E, 110-1F, 110-1G, 110-1H, 110-1J, 110-1K, 110-1L, 110-1M, 110-1N, 110-1P, 110-1Q, 110-1R, 110-1S, and 110-1T, the terminal 110-1T included in the inspection terminal group 126b2 is located closest to the side 103 in the terminal row including the terminals 110-1A, 110-1B, 110-1C, 110-1D, 110-1E, 110-1F, 110-1G, 110-1H, 110-1J, 110-1K, 110-1L, 110-1M, 110-1N, 110-1P, 110-1Q, 110-1R, 110-1S, and 110-1T, the terminal 110-18A included in the inspection terminal group 126b3 is located closest to the side 102 in the terminal row including the terminals 110-18A, 110-18B, 110-18C, 110-18D, 110-18E, 110-18F, 110-18G, 110-18H, 110-18J, 110-18K, 110-18L, 110-18M, 110-18N, 110-18P, 110-18Q, 110-18R, 110-18S, and 110-18T, and the terminal 110-18T included in the inspection terminal group 126b4 is located closest to the side 103 in the terminal row including the terminal 110-18A, 110-18B, 110-18C, 110-18D, 110-18E, 110-18F, 110-18G, 110-18H, 110-18J, 110-18K, 110-18L, 110-18M, 110-18N, 110-18P, 110-18Q, 110-18R, 110-18S, and 110-18T.

That is, at the terminal mounting surface 101 including the sides 102, 103, 104, and 105, the terminal 110-1A included in the inspection terminal group 126b1 is located in the vicinity of a corner portion at which the side 102 and the side 104 intersect with each other, the terminal 110-1T included in the inspection terminal group 126b2 is located in the vicinity of a corner portion at which the side 103 and the side 104 intersect with each other, the terminal 110-18A included in the inspection terminal group 126b3 is located in the vicinity of a corner portion at which the side 102 and the side 105 intersect with each other, and the terminal 110-18T included in the inspection terminal group 126b4 is located in the vicinity of a corner portion at which the sides 103 and 105 intersect with each other. In other words, each of the terminal 110-1A included in the inspection terminal group 126b1, the terminal 110-1T included in the inspection terminal group 126b2, the terminal 110-18A included in the inspection terminal group 126b3, and the terminal 110-18T included in the inspection terminal group 126b4 is located in the vicinity of the four corner positions of the terminal mounting surface 101 including the sides 102, 103, 104, and 105.

Therefore, with the semiconductor apparatus 1 according to the third embodiment, it is possible to execute an inspection for improving the reliability of the semiconductor apparatus 1 having many functions, as compared with the semiconductor apparatus 1 according to the first embodiment and the second embodiment.

Here, among the plurality of terminals 110 arranged from the side 102 toward the side 103, the terminal row including the terminals 110-1A, 110-1B, 110-1C, 110-1D, 110-1E, 110-1F, 110-1G, 110-1H, 110-1J, 110-1K, 110-1L, 110-1M, 110-1N, 110-1P, 110-1Q, 110-1R, 110-1S, and 110-1T located adjacent to the side 104 is an example of a first terminal row according to the third embodiment, the terminal 110-1A included in the first terminal row and included in the inspection terminal group 126b1 is an example of a first inspection terminal according to the third embodiment, and the terminal 110-1T included in the first terminal row and included in the inspection terminal group 126b1 is an example of a fourth inspection terminal according to the third embodiment. In addition, among the plurality of terminals 110 arranged from the side 102 toward the side 103, the terminal row including the terminals 110-18A, 110-18B, 110-18C, 110-18D, 110-18E, 110-18F, 110-18G, 110-18H, 110-18J, 110-18K, 110-18L, 110-18M, 110-18N, 110-18P, 110-18Q, 110-18R, 110-18S, and 110-18T located adjacent to the side 105 is an example of a second terminal row according to the third embodiment, the terminal 110-18A included in the second terminal row and included in the inspection terminal group 126b3 is an example of a second inspection terminal according to the third embodiment, and the terminal 110-18T included in the second terminal row and included in the inspection terminal group 126b4 is an example of a third inspection terminal according to the third embodiment.

4. Fourth Embodiment

Next, the semiconductor apparatus 1 according to a fourth embodiment will be described. In description of the semiconductor apparatus 1 according to the fourth embodiment, the same components as those in the semiconductor apparatus 1 according to the first embodiment to the third embodiment are designated by the same reference numerals, and the description is omitted or simplified, in some cases. In the semiconductor apparatus 1 according to the fourth embodiment, arrangement of the plurality of terminals 110 included in the inspection terminal group 126 is different from that of the semiconductor apparatus 1 according to the first embodiment to the third embodiment.

Figure 7:
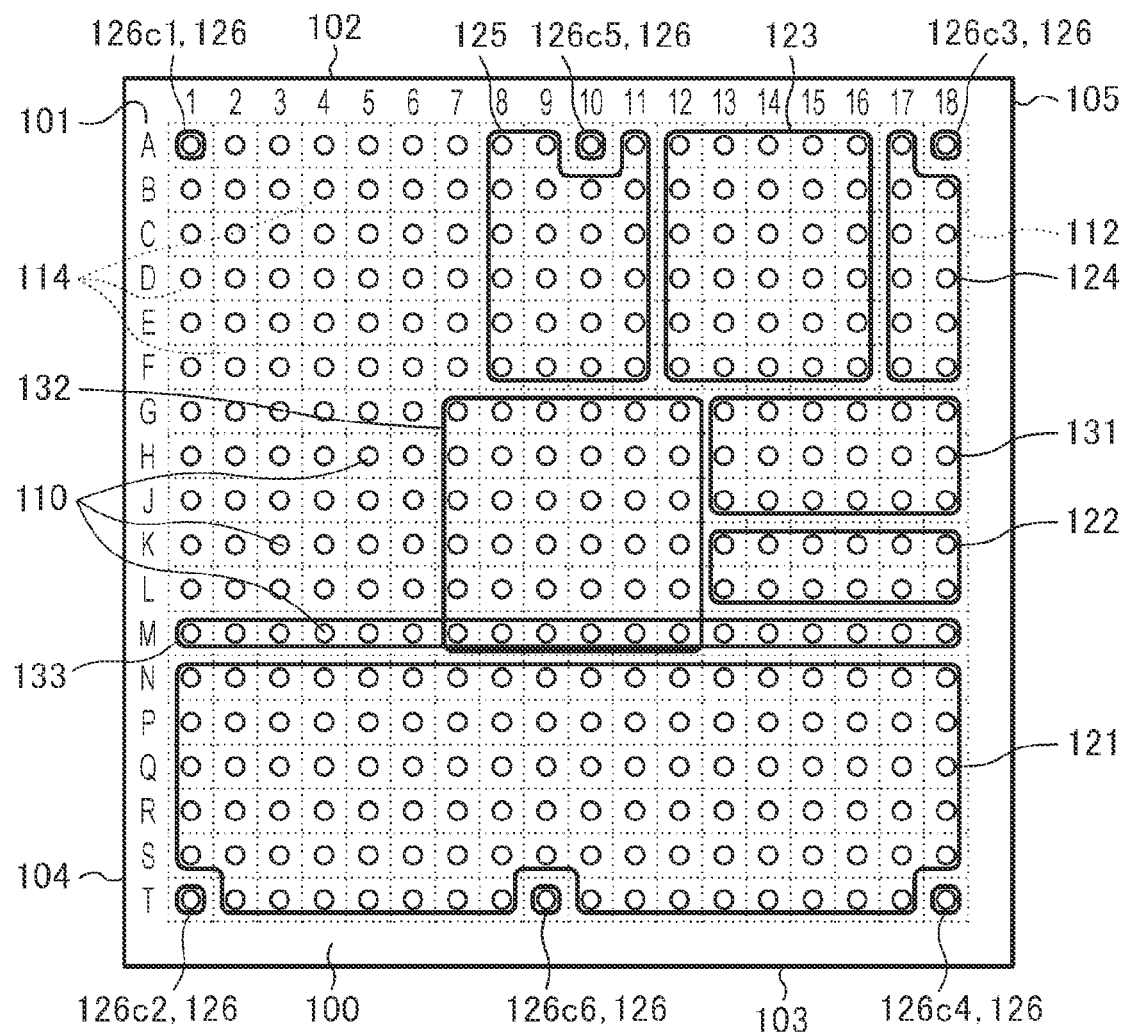
FIG. 7 is a diagram illustrating an example when signals propagating at a plurality of terminals in a semiconductor apparatus according to a fourth embodiment are assigned to each terminal.

FIG. 7 is a diagram illustrating an example when signals propagating at the plurality of terminals 110 in the semiconductor apparatus 1 according to the fourth embodiment are assigned to each terminal 110. As illustrated in FIG. 7, in the semiconductor apparatus 1 according to the fourth embodiment, some of the plurality of terminals 110 included in the inspection terminal group 126 are located adjacent to the side 104 of the terminal mounting surface 101, some different terminals of the plurality of terminals 110 included in the inspection terminal group 126 are located adjacent to the side 105 of the terminal mounting surface 101, some different terminals of the plurality of terminals 110 included in the inspection terminal group 126 are located adjacent to the side 102 of the terminal mounting surface 101, and some different terminals of the plurality of terminals 110 included in the inspection terminal group 126 are located adjacent to the side 103 of the terminal mounting surface 101. That is, the plurality of terminals 110 included in the inspection terminal group 126 are located along an outer circumference of the terminal mounting surface 101.

One of the plurality of terminals 110 included in the inspection terminal group 126 located adjacent to the side 104 of the terminal mounting surface 101 is located in the vicinity of the side 102, one of the plurality of terminals 110 included in the inspection terminal group 126 located adjacent to the side 104 of the terminal mounting surface 101 is located in the vicinity of the side 103, one of the plurality of terminals 110 included in the inspection terminal group 126 located adjacent to the side 105 of the terminal mounting surface 101 is located in the vicinity of the side 102, and one of the plurality of terminals 110 included in the inspection terminal group 126 located adjacent to the side 105 of the terminal mounting surface 101 is located in the vicinity of the side 103. That is, the semiconductor apparatus 1 according to the fourth embodiment is different from the semiconductor apparatus 1 described in the third embodiment in that some of the plurality of terminals 110 included in the inspection terminal group 126 are located adjacent to the side 102 and the side 103 of the terminal mounting surface 101.

Here, in FIG. 7, among the plurality of terminals 110 included in the inspection terminal group 126, the inspection terminal group 126 including the terminal 110 located adjacent to the side 104 of the terminal mounting surface 101 and located in the vicinity of the side 102 is illustrated as an inspection terminal group 126c1, among the plurality of terminals 110 included in the inspection terminal group 126, the inspection terminal group 126 including the terminal 110 located adjacent to the side 104 of the terminal mounting surface 101 and located in the vicinity of the side 103 is illustrated as an inspection terminal group 126c2, among the plurality of terminals 110 included in the inspection terminal group 126, the inspection terminal group 126 including the terminal 110 located adjacent to the side 105 of the terminal mounting surface 101 and located in the vicinity of the side 102 is illustrated as an inspection terminal group 126c3, among the plurality of terminals 110 included in the inspection terminal group 126, the inspection terminal group 126 including the terminal 110 located adjacent to the side 105 of the terminal mounting surface 101 and located in the vicinity of the side 103 is illustrated as an inspection terminal group 126c4, the inspection terminal group 126 including the terminal 110 located adjacent to the side 102 of the terminal mounting surface 101 is illustrated as an inspection terminal group 126c5, and the inspection terminal group 126 including the terminal 110 located adjacent to the side 103 of the terminal mounting surface 101 is illustrated as an inspection terminal group 126c6.

In the semiconductor apparatus 1 according to the fourth embodiment, the terminal 110-1A included in the inspection terminal group 126c1 and the terminal 110-1T included in the inspection terminal group 126c2 are included in the terminal row including the terminals 110-1A, 110-1B, 110-1C, 110-1D, 110-1E, 110-1F, 110-1G, 110-1H, 110-1J, 110-1K, 110-1L, 110-1M, 110-1N, 110-1P, 110-1Q, 110-1R, 110-1S, and 110-1T located adjacent to the side 104 among the plurality of terminals 110 arranged from the side 102 toward the side 103, the terminal 110-18A included in the inspection terminal group 126c3 and the terminal 110-18T included in the inspection terminal group 126c4 are included in the terminal row including the terminals 110-18A, 110-18B, 110-18C, 110-18D, 110-18E, 110-18F, 110-18G, 110-18H, 110-18J, 110-18K, 110-18L, 110-18M, 110-18N, 110-18P, 110-18Q, 110-18R, 110-18S, and 110-18T located adjacent to the side 105 among the plurality of terminals 110 arranged from the side 102 toward the side 103, the terminal 110-10A included in the inspection terminal group 126c5 is included in the terminal row including the terminals 110-1A to 110-18A located adjacent to the side 102 among the plurality of terminals 110 arranged from the side 104 toward the side 105, and the terminal 110-9T included in the inspection terminal group 126c6 is included in the terminal row including the terminals 110-1T to 110-18T located adjacent to the side 103 among the plurality of terminals 110 arranged from the side 104 toward the side 105.

The terminal 110-1A included in the inspection terminal group 126c1 is located closest to the side 102 in the terminal row including the terminals 110-1A, 110-1B, 110-1C, 110-1D, 110-1E, 110-1F, 110-1G, 110-1H, 110-1J, 110-1K, 110-1L, 110-1M, 110-1N, 110-1P, 110-1Q, 110-1R, 110-1S, and 110-1T, the terminal 110-1T included in the inspection terminal group 126c2 is located closest to the side 103 in the terminal row including the terminals 110-1A, 110-1B, 110-1C, 110-1D, 110-1E, 110-1F, 110-1G, 110-1H, 110-1J, 110-1K, 110-1L, 110-1M, 110-1N, 110-1P, 110-1Q, 110-1R, 110-1S, and 110-1T, the terminal 110-18A included in the inspection terminal group 126c3 is located closest to the side 102 in the terminal row including the terminals 110-18A, 110-18B, 110-18C, 110-18D, 110-18E, 110-18F, 110-18G, 110-18H, 110-18J, 110-18K, 110-18L, 110-18M, 110-18N, 110-18P, 110-18Q, 110-18R, 110-18S, and 110-18T, and the terminal 110-18T included in the inspection terminal group 126c4 is located closest to the side 103 in the terminal row including the terminal 110-18A, 110-18B, 110-18C, 110-18D, 110-18E, 110-18F, 110-18G, 110-18H, 110-18J, 110-18K, 110-18L, 110-18M, 110-18N, 110-18P, 110-18Q, 110-18R, 110-18S, and 110-18T.

That is, at the terminal mounting surface 101 including the sides 102, 103, 104, and 105, the terminal 110-1A included in the inspection terminal group 126c1 is located in the vicinity of a corner portion at which the side 102 and the side 104 intersect with each other, the terminal 110-1T included in the inspection terminal group 126c2 is located in the vicinity of a corner portion at which the side 103 and the side 104 intersect with each other, the terminal 110-18A included in the inspection terminal group 126c3 is located in the vicinity of a corner portion at which the side 102 and the side 105 intersect with each other, and the terminal 110-18T included in the inspection terminal group 126c4 is located in the vicinity of a corner portion at which the sides 103 and 105 intersect with each other. The terminal 110-10A included in the inspection terminal group 126c5 is located adjacent to the side 102 between the terminal 110-1A included in the inspection terminal group 126c1 and the terminal 110-18A included in the inspection terminal group 126c3, and the terminal 110-10T included in the inspection terminal group 126c6 is located adjacent to the side 103 and between the terminal 110-1T included in the inspection terminal group 126c2 and the terminal 110-18T included in the inspection terminal group 126c4.

Therefore, with the semiconductor apparatus 1 according to the fourth embodiment, it is possible to execute an inspection for improving the reliability of the semiconductor apparatus 1 having many functions, as compared with the semiconductor apparatus 1 according to the first embodiment and the third embodiment.

Here, among the plurality of terminals 110 arranged from the side 102 toward the side 103, the terminal row including the terminals 110-1A, 110-1B, 110-1C, 110-1D, 110-1E, 110-1F, 110-1G, 110-1H, 110-1J, 110-1K, 110-1L, 110-1M, 110-1N, 110-1P, 110-1Q, 110-1R, 110-1S, and 110-1T located adjacent to the side 104 is an example of a first terminal row according to the fourth embodiment, the terminal 110-1A included in the first terminal row and included in the inspection terminal group 126c1 is an example of a first inspection terminal according to the fourth embodiment, and the terminal 110-1T included in the first terminal row and included in the inspection terminal group 126c2 is an example of a fourth inspection terminal according to the fourth embodiment. In addition, among the plurality of terminals 110 arranged from the side 102 toward the side 103, the terminal row including the terminals 110-18A, 110-18B, 110-18C, 110-18D, 110-18E, 110-18F, 110-18G, 110-18H, 110-18J, 110-18K, 110-18L, 110-18M, 110-18N, 110-18P, 110-18Q, 110-18R, 110-18S, and 110-18T located adjacent to the side 105 is an example of a second terminal row according to the fourth embodiment, the terminal 110-18A included in the second terminal row and included in the inspection terminal group 126c3 is an example of a second inspection terminal according to the fourth embodiment, and the terminal 110-18T included in the second terminal row and included in the inspection terminal group 126c4 is an example of a third inspection terminal according to the fourth embodiment.

Further, among the plurality of terminals 110 arranged from the side 104 toward the side 105, the terminal row including the terminals 110-1A to 110-18A located adjacent to the side 102 is an example of a third terminal row according to the fourth embodiment, and the terminal 110-10A included in the third terminal row and included in the inspection terminal group 126c5 is an example of a fifth inspection terminal according to the fourth embodiment. Among the plurality of terminals 110 arranged from the side 104 toward the side 105, the terminal row including the terminals 110-1T to 110-18T located adjacent to the side 103 is an example of a fourth terminal row according to the fourth embodiment, and the terminal 110-9T included in the fourth terminal row and included in the inspection terminal group 126c6 is an example of a sixth inspection terminal according to the fourth embodiment.

5. Modification Example

Figure 8:
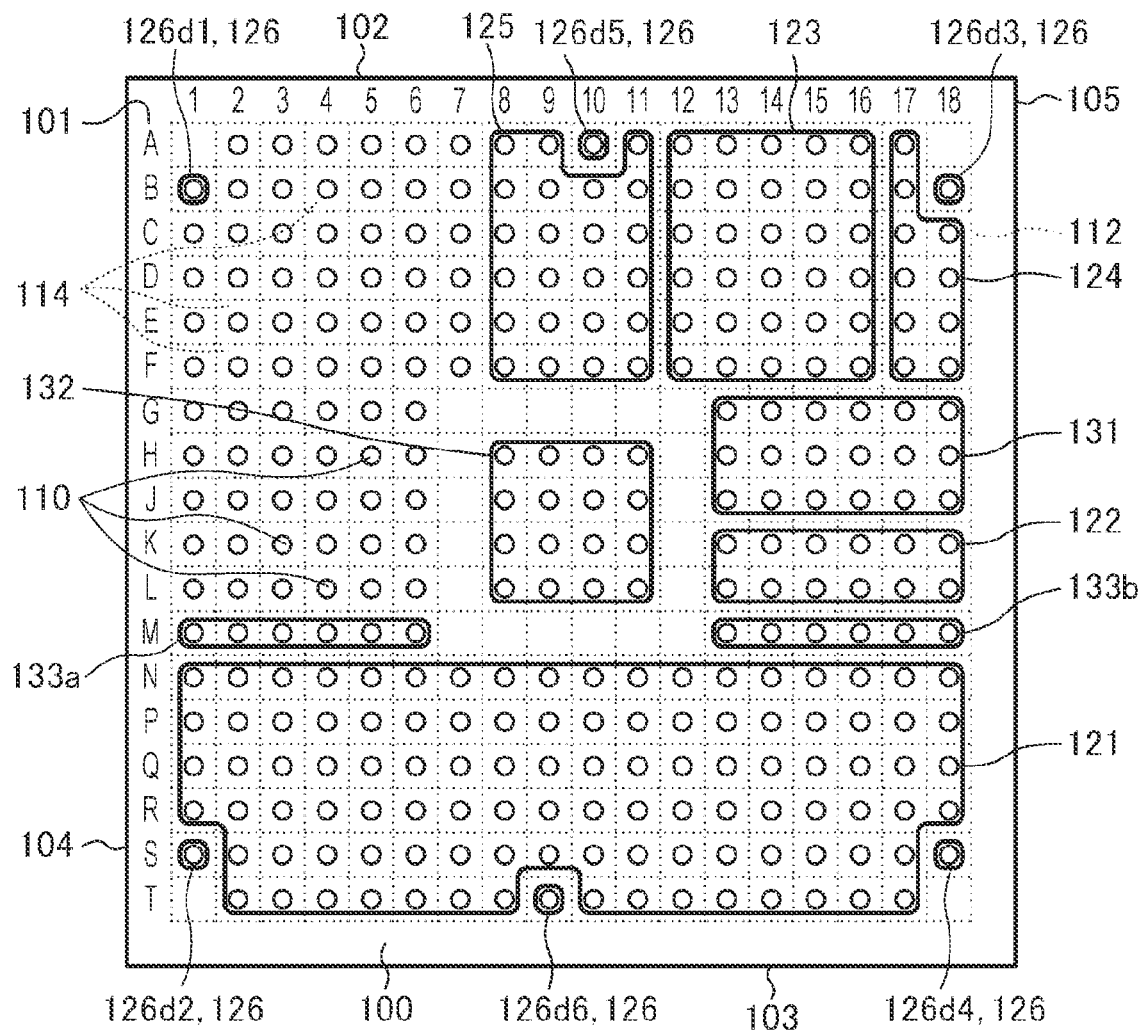
FIG. 8 is a diagram illustrating an example when signals propagating at a plurality of terminals in a semiconductor apparatus according to a modification example are assigned to each terminal.

In the semiconductor apparatus 1 according to the first embodiment to the fourth embodiment described above, the terminals 110 are mounted in all of the plurality of terminal mounting areas 114 provided in a grid pattern at the terminal mounting surface 101, and as illustrated in FIG. 8, the terminal mounting surface 101 may include the terminal mounting area 114 in which the terminal 110 is not provided. FIG. 8 is a diagram illustrating an example when signals propagating at the plurality of terminals 110 in the semiconductor apparatus 1 according to a modification example are assigned to each terminal 110. FIG. 8 illustrates an example when the semiconductor apparatus 1 according to the fourth embodiment includes the terminal mounting area 114 in which the terminal 110 is not provided. Further, in FIG. 8, the inspection terminal group 126 corresponding to each of the inspection terminal groups 126c1 to 126c6 according to the fourth embodiment is illustrated as inspection terminal groups 126d1 to 126d6.

With the semiconductor apparatus 1 according to the modification example configured as illustrated in FIG. 8, it is also possible to obtain the same effects as the semiconductor apparatuses 1 illustrated in the first embodiment to the fourth embodiment.

6. Different Concept for Terminal Mounting Area

Further, in the semiconductor apparatus 1 of the first embodiment to the fourth embodiment, it is described that the plurality of terminals 110 are located corresponding to the terminal mounting areas 114 arranged in a grid pattern included in the mounting area 112, but the mounting area 112 and the terminal mounting area 114 can also be defined based on arrangement of the plurality of terminals 110 provided at the terminal mounting surface 101.

FIG. 9 is a diagram for explaining a case where the mounting area 112 and the terminal mounting area 114 are defined based on arrangement of the plurality of terminals 110 provided at the terminal mounting surface 101. In the example illustrated in FIG. 9, for the purpose of describing a specific example when the mounting area 112 and the terminal mounting area 114 are defined based on arrangement of the plurality of terminals 110 provided at the terminal mounting surface 101, a case where the terminals 110 are not located in some of the terminal mounting areas 114 is illustrated. Further, in FIG. 9, in order to distinguish from the semiconductor apparatus 1 of the first embodiment to the fourth embodiment, the terminal mounting surface 101 is referred to as a terminal mounting surface 101a, and the sides 102, 103, 104, and 105 are respectively referred to as sides 102a, 103a, 104a, and 105a. Further, in FIG. 9, the X-direction, the Y-direction, and the Z-direction, which are orthogonal to each other as illustrated in the drawing, will be used.

As illustrated in FIG. 9, the plurality of terminals 110 are located at the terminal mounting surface 101a. An intersection at which a virtual line passing through at least one terminal 110 in the row direction from the side 104a to the side 105a along the side 102a and a virtual line passing through at least one terminal 110 in the column direction from the side 102a to the side 103a along the side 104a intersect with each other corresponds to the terminal mounting area 114.

Specifically, in an example of arrangement of the terminals 110 illustrated in FIG. 9, 18 virtual lines in a direction along the side 102a and 18 virtual lines in a direction along the side 104a can be obtained. Therefore, when the example of the arrangement of the terminals 110 illustrated in FIG. 9 is used, a total of 324 intersections are generated at the terminal mounting surface 101a. That is, when the example of the arrangement of the terminals 110 illustrated in FIG. 9 is used, the terminal mounting surface 101a includes a total of 324 terminal mounting areas 114 arranged in a grid pattern.

Among the intersections at which a total of 324 virtual lines intersect, an area surrounded by an intersection closest to a point at which the side 102a and the side 104a intersect with each other, an intersection closest to a point at which the side 104a and the side 103a intersect with each other, an intersection closest to a point at which the side 103a and the side 105a intersect with each other, and an intersection closest to a point at which the side 105a and the side 102a intersect with each other corresponds to the mounting area 112.

As described above, with the mounting area 112 and the terminal mounting area 114 defined based on the arrangement of the plurality of terminals 110 provided at the terminal mounting surface 101, it is also possible to obtain the same effects as that of the semiconductor apparatus 1 described in the first embodiment to the fourth embodiment.

The embodiments and the modification examples are described above, but the present disclosure is not limited to the present embodiment, and can be implemented in various aspects without departing from a gist thereof. For example, the above embodiments can be combined as appropriate.

The present disclosure includes substantially the same configuration as the configuration described in the embodiment (for example, a configuration having the same function, method and result or a configuration having the same object and effect). In addition, the present disclosure includes a configuration in which non-essential parts of the configuration described in the embodiment are replaced. Further, the present disclosure includes a configuration which achieves the same action and effect as the configuration described in the embodiment or a configuration which can achieve the same object. In addition, the present disclosure includes a configuration in which a known technology is added to the configuration described in the embodiment.

The following contents are derived from the above-described embodiments and modification examples.

One aspect of a semiconductor apparatuses includes a memory controller; a CPU; a high-speed communication controller; a plurality of memory operation terminals for inputting a first signal propagating between an external memory group and the memory controller; a plurality of high-speed communication terminals for inputting a second signal to the high-speed communication controller; a plurality of inspection terminals for acquiring information from the CPU and performing debugging; and a terminal mounting surface at which a plurality of coupling terminals including the plurality of memory operation terminals, the plurality of high-speed communication terminals, and the plurality of inspection terminals are provided, in which the terminal mounting surface includes a first side, a second side located facing the first side, a third side intersecting both the first side and the second side, and a fourth side located facing the third side, the plurality of coupling terminals include a first terminal row located adjacent to the third side and arranged from the first side toward the second side; the first terminal row includes a first inspection terminal among the plurality of inspection terminals, and the first inspection terminal is located closest to the first side in the first terminal row.

According to the semiconductor apparatus, the first inspection terminal among the plurality of inspection terminals included in the plurality of coupling terminals provided at the terminal mounting surface is located adjacent to the third side of the terminal mounting surface and is located closest to the first side in the first terminal row arranged from the first side toward the second side. That is, the first inspection terminal among the plurality of inspection terminals is located at a corner portion at which the third side and the first side intersect with each other in the terminal mounting surface at which the plurality of terminals are provided. Therefore, with the inspection terminal, it is possible to inspect whether a defect such as chipping, warping, bending, or the like occurs in the semiconductor apparatus, to inspect mounting confirmation of the semiconductor apparatus, and to inspect a function of the semiconductor apparatus. That is, according to the semiconductor apparatus, it is possible to acquire a plurality of pieces of information on the semiconductor apparatus by the inspection executed with the plurality of inspection terminals. Therefore, it is possible to execute an inspection for improving the reliability of the semiconductor apparatus having many functions.

One aspect of a semiconductor apparatuses includes a memory controller; a CPU; a high-speed communication controller; a plurality of memory operation terminals for inputting a first signal propagating between an external memory group and the memory controller; a plurality of high-speed communication terminals for inputting a second signal to the high-speed communication controller; a plurality of inspection terminals for acquiring information from the CPU and performing debugging; and a terminal mounting surface at which a plurality of coupling terminals including the plurality of memory operation terminals, the plurality of high-speed communication terminals, and the plurality of inspection terminals are provided, in which the terminal mounting surface includes a first side, a second side located facing the first side, a third side intersecting both the first side and the second side, and a fourth side located facing the third side, the plurality of coupling terminals includes a first terminal row located adjacent to the third side and arranged from the first side toward the second side, and a second terminal row located adjacent to the fourth side and arranged from the first side toward the second side, the first terminal row includes a first inspection terminal among the plurality of inspection terminals, and the second terminal row includes a second inspection terminal among the plurality of inspection terminals.

According to the semiconductor apparatus, the first inspection terminal among the plurality of inspection terminals included in the plurality of coupling terminals provided at the terminal mounting surface is included in the first terminal row located adjacent to the third side and arranged from the first side toward the second side of the terminal mounting surface, and the second inspection terminal among the plurality of inspection terminals included in the plurality of coupling terminals provided at the terminal mounting surface is included in the second terminal row located adjacent to the fourth side, which is located facing the third side of the terminal mounting surface, and arranged from the first side toward the second side. That is, the first inspection terminal and the second inspection terminal among the plurality of inspection terminals are respectively located in the vicinities of the opposite sides, at the terminal mounting surface at which the plurality of terminals are provided. Therefore, with the inspection terminal, it is possible to inspect whether a defect such as chipping, warping, bending, or the like occurs in the semiconductor apparatus, to inspect mounting confirmation of the semiconductor apparatus, and to inspect a function of the semiconductor apparatus. That is, according to the semiconductor apparatus, it is possible to acquire a plurality of pieces of information on the semiconductor apparatus by the inspection executed with the plurality of inspection terminals. Therefore, it is possible to execute an inspection for improving the reliability of the semiconductor apparatus having many functions.

In one aspect of the semiconductor apparatus, the first inspection terminal may be located closest to the first side in the first terminal row.

According to the semiconductor apparatus, since the first inspection terminal is located in the vicinity of the corner portion of the terminal mounting surface, it is possible to execute an inspection for further improving the reliability of the semiconductor apparatus having many functions.

In one aspect of the semiconductor apparatus, the second inspection terminal may be located closest to the first side in the second terminal row.

According to the semiconductor apparatus, since the second inspection terminal is located in the vicinity of the corner portion of the terminal mounting surface, it is possible to execute an inspection for further improving the reliability of the semiconductor apparatus having many functions.

In one aspect of the semiconductor apparatus, the second terminal row may include a third inspection terminal among the plurality of inspection terminals, and the third inspection terminal may be located closest to the second side in the second terminal row.

According to the semiconductor apparatus, since the plurality of inspection terminals include the third inspection terminal and the third inspection terminal is located at the corner portion of the terminal mounting surface, it is possible to execute an inspection for improving the reliability of the semiconductor apparatus having many functions.

In one aspect of the semiconductor apparatus, the first terminal row may include a fourth inspection terminal among the plurality of inspection terminals, and the fourth inspection terminal may be located closest to the second side in the first terminal row.

According to the semiconductor apparatus, since the plurality of inspection terminals include the fourth inspection terminal and the fourth inspection terminal is located at the corner portion of the terminal mounting surface, it is possible to execute an inspection for improving the reliability of the semiconductor apparatus having many functions.

In one aspect of the semiconductor apparatus, the plurality of coupling terminals may include a third terminal row located adjacent to the first side and arranged from the third side toward the fourth side, and the third terminal row may include a fifth inspection terminal among the plurality of inspection terminals.

According to the semiconductor apparatus, since the plurality of inspection terminals include the fifth inspection terminal, it is possible to execute an inspection for further improving the reliability of the semiconductor apparatus having many functions.

In one aspect of the semiconductor apparatus, the plurality of coupling terminals may include a fourth terminal row located adjacent to the second side and arranged from the third side toward the fourth side, and the fourth terminal row may include a sixth inspection terminal among the plurality of inspection terminals.

According to the semiconductor apparatus, since the plurality of inspection terminals include the sixth inspection terminal, it is possible to execute an inspection for further improving the reliability of the semiconductor apparatus having many functions.

In one aspect of the semiconductor apparatus, the high-speed communication controller may perform communication at a frequency equal to or more than 5 GHz.

In one aspect of the semiconductor apparatus, the high-speed communication controller may include a USB communication controller that controls USB communication, and a USB communication signal for performing the USB communication may be propagated to a first high-speed communication terminal among the plurality of high-speed communication terminals.

In one aspect of the semiconductor apparatus, the high-speed communication controller may include a PCIe communication controller that controls PCIe communication, and a PCIe communication signal for performing the PCIe communication may be propagated to a second high-speed communication terminal among the plurality of high-speed communication terminals.

In one aspect of the semiconductor apparatus, the CPU may have a plurality of cores, include a microarchitecture which implements a command set of 64-bit or more, and be driven at a frequency equal to or more than 1.6 GHz.

In one aspect of the semiconductor apparatus, the CPU may have a floating point unit only inside.

According to the semiconductor apparatus, since the CPU has the floating point unit only inside, it is possible to reduce the number of passing-through circuit blocks as compared when the floating point unit only is provided externally. As a result, it is possible to operate at high speed while reducing power consumption when the CPU processes a large amount of data. Therefore, it is possible to increase a speed of the operation while reducing power consumption of the semiconductor apparatus.

What is claimed is:

1. A semiconductor apparatus comprising:
a memory controller;
a CPU;
a high-speed communication controller;
a plurality of memory operation terminals for inputting a first signal propagating between an external memory group and the memory controller;
a plurality of high-speed communication terminals for inputting a second signal to the high-speed communication controller;
a plurality of inspection terminals for acquiring information from the CPU and performing debugging; and
a terminal mounting surface at which a plurality of coupling terminals including the plurality of memory operation terminals, the plurality of high-speed communication terminals, and the plurality of inspection terminals are distant from each other in first and second directions of the terminal mounting surface that perpendicularly intersect with each other and the plurality of inspection terminals are arranged to receive JTAG (Joint Test Action Group) standard signals, wherein
the terminal mounting surface includes a first side, a second side located facing the first side, a third side intersecting both the first side and the second side, and a fourth side located facing the third side,
the plurality of coupling terminals include a first terminal row located adjacent to the third side and arranged from the first side toward the second side to extend along the first direction of the terminal mounting surface,
the first terminal row includes a first inspection terminal among the plurality of inspection terminals,
the first inspection terminal is located closest to the first side in the first terminal row, and
the first inspection terminal is arranged relative to at least one of the plurality of high-speed communication terminals in the second direction of the terminal mounting surface, and is arranged relative to at least one of the plurality of memory operation terminals in the first direction of the terminal mounting surface.

2. A semiconductor apparatus comprising:
a memory controller;
a CPU;
a high-speed communication controller;
a plurality of memory operation terminals for inputting a first signal propagating between an external memory group and the memory controller;
a plurality of high-speed communication terminals for inputting a second signal to the high-speed communication controller;
a plurality of inspection terminals for acquiring information from the CPU and performing debugging; and
a terminal mounting surface at which a plurality of coupling terminals including the plurality of memory operation terminals, the plurality of high-speed communication terminals, and the plurality of inspection terminals are distant from each other in first and second directions of the terminal mounting surface that perpendicularly intersect with each other and the plurality of inspection terminals are arranged to receive JTAG (Joint Test Action Group) standard signals, wherein
the terminal mounting surface includes a first side, a second side located facing the first side, a third side intersecting both the first side and the second side, and a fourth side located facing the third side, the plurality of coupling terminals includes a first terminal row located adjacent to the third side and arranged from the first side toward the second side to extend along the first direction of the terminal mounting surface, and a second terminal row located adjacent to the fourth side and arranged from the first side toward the second side, the first terminal row includes a first inspection terminal among the plurality of inspection terminals, the second terminal row includes a second inspection terminal among the plurality of inspection terminals, and the first inspection terminal is arranged relative to at least one of the plurality of high-speed communication terminals in the second direction of the terminal mounting surface, and is arranged relative to at least one of the plurality of memory operation terminals in the first direction of the terminal mounting surface.

3. The semiconductor apparatus according to claim 2, wherein
the first inspection terminal is located closest to the first side in the first terminal row.

4. The semiconductor apparatus according to claim 2, wherein
the second inspection terminal is located closest to the first side in the second terminal row.

5. The semiconductor apparatus according to claim 2, wherein
the second terminal row includes a third inspection terminal among the plurality of inspection terminals, and
the third inspection terminal is located closest to the second side in the second terminal row.

6. The semiconductor apparatus according to claim 1, wherein
the first terminal row includes a fourth inspection terminal among the plurality of inspection terminals, and
the fourth inspection terminal is located closest to the second side in the first terminal row.

7. The semiconductor apparatus according to claim 1, wherein
the plurality of coupling terminals include a third terminal row located adjacent to the first side and arranged from the third side toward the fourth side, and
the third terminal row includes a fifth inspection terminal among the plurality of inspection terminals.

8. The semiconductor apparatus according to claim 1, wherein
the plurality of coupling terminals include a fourth terminal row located adjacent to the second side and arranged from the third side toward the fourth side, and
the fourth terminal row includes a sixth inspection terminal among the plurality of inspection terminals.

9. The semiconductor apparatus according to claim 1, wherein
the high-speed communication controller performs communication at a frequency equal to or more than 5 GHz.

10. The semiconductor apparatus according to claim 1, wherein
the high-speed communication controller includes a USB communication controller that controls USB communication, and
a USB communication signal for performing the USB communication is propagated to a first high-speed communication terminal among the plurality of high-speed communication terminals.

11. The semiconductor apparatus according to claim 1, wherein
the high-speed communication controller includes a PCIe communication controller that controls PCIe communication, and
a PCIe communication signal for performing the PCIe communication is propagated to a second high-speed communication terminal among the plurality of high-speed communication terminals.

12. The semiconductor apparatus according to claim 1, wherein
the CPU
has a plurality of cores,
includes a microarchitecture which implements a command set of 64-bit or more, and
is driven at a frequency equal to or more than 1.6 GHz.

13. The semiconductor apparatus according to claim 1, wherein
the CPU includes a floating point unit mounted inside the CPU.

14. The semiconductor apparatus according to claim 1, wherein
the plurality of inspection terminals form debug terminals that support JTAG standards and are electrically connected to a printed wiring substrate.

15. The semiconductor apparatus according to claim 2, wherein
the plurality of inspection terminals form debug terminals that support JTAG standards and are electrically connected to a printed wiring substrate.

16. A semiconductor apparatus comprising:
a memory controller;
a CPU;
a high-speed communication controller;
a plurality of memory operation terminals for inputting a first signal propagating between an external memory group and the memory controller;
a plurality of high-speed communication terminals for inputting a second signal to the high-speed communication controller;
a plurality of inspection terminals for acquiring information from the CPU and performing debugging; and
a terminal mounting surface at which a plurality of coupling terminals including the plurality of memory operation terminals, the plurality of high-speed communication terminals, and the plurality of inspection terminals are distant from each other in first and second directions of the terminal mounting surface that intersect with each other and the plurality of inspection terminals are arranged to receive JTAG (Joint Test Action Group) standard signals, wherein
the terminal mounting surface includes a first side, a second side located facing the first side, a third side intersecting both the first side and the second side, and a fourth side located facing the third side,
the plurality of coupling terminals includes a first terminal row located adjacent to the third side and arranged from the first side toward the second side, and a second terminal row located adjacent to the fourth side and arranged from the first side toward the second side,
the first terminal row includes a first inspection terminal among the plurality of inspection terminals,
the second terminal row includes a second inspection terminal among the plurality of inspection terminals, and
at least one of the plurality of high-speed communication terminals is disposed between the first inspection terminal and the second inspection terminal in a direction directing from the third side to the fourth side.

17. A semiconductor apparatus comprising:
a memory controller;
a CPU;
a high-speed communication controller;
a plurality of memory operation terminals for inputting a first signal propagating between an external memory group and the memory controller;
a plurality of high-speed communication terminals for inputting a second signal to the high-speed communication controller;
a plurality of inspection terminals for acquiring information from the CPU and performing debugging; and
a terminal mounting surface at which a plurality of coupling terminals including the plurality of memory operation terminals, the plurality of high-speed communication terminals, and the plurality of inspection terminals are distant from each other in first and second directions of the terminal mounting surface that intersect with each other and the plurality of inspection terminals are arranged to receive JTAG (Joint Test Action Group) standard signals, wherein
the terminal mounting surface includes a first side, a second side located facing the first side, a third side intersecting both the first side and the second side, and a fourth side located facing the third side,
the plurality of coupling terminals includes a first terminal row located adjacent to the third side and arranged from the first side toward the second side, and a second terminal row located adjacent to the fourth side and arranged from the first side toward the second side,
the first terminal row includes a first inspection terminal among the plurality of inspection terminals,
the second terminal row includes a second inspection terminal and a third inspection terminal among the plurality of inspection terminals,
the third inspection terminal is located closest to the second side in the second terminal row, and
at least one of the plurality of high-speed communication terminals is disposed between the second inspection terminal and the third inspection terminal in a direction directing from the first side to the second side.

18. A semiconductor apparatus comprising:
a memory controller;
a CPU;
a high-speed communication controller;
a plurality of memory operation terminals for inputting a first signal propagating between an external memory group and the memory controller;
a plurality of high-speed communication terminals for inputting a second signal to the high-speed communication controller;
a plurality of inspection terminals for acquiring information from the CPU and performing debugging; and
a terminal mounting surface at which a plurality of coupling terminals including the plurality of memory operation terminals, the plurality of high-speed communication terminals, and the plurality of inspection terminals are distant from each other in first and second directions of the terminal mounting surface that intersect with each other and the plurality of inspection terminals are arranged to receive JTAG (Joint Test Action Group) standard signals, wherein
the terminal mounting surface includes a first side, a second side located facing the first side, a third side intersecting both the first side and the second side, and a fourth side located facing the third side,
the plurality of coupling terminals includes a first terminal row located adjacent to the third side and arranged from the first side toward the second side, and a second terminal row located adjacent to the fourth side and arranged from the first side toward the second side,
the first terminal row includes a first inspection terminal among the plurality of inspection terminals,
the second terminal row includes a second inspection terminal and a third inspection terminal among the plurality of inspection terminals,
the third inspection terminal is located closest to the second side in the second terminal row, and
at least one of the plurality of high-speed communication terminals and at least one of the plurality of memory operation terminals are disposed between the second inspection terminal and the third inspection terminal in a direction directing from the first side to the second side.

* * * * *